US009130520B2

(12) United States Patent
Mitsuishi et al.

(10) Patent No.: US 9,130,520 B2
(45) Date of Patent: Sep. 8, 2015

(54) DIFFERENTIAL OUTPUT CIRCUIT AND SEMICONDUCTOR DEVICE

(71) Applicant: RENESAS ELECTRONICS CORPORATION, Kanagawa (JP)

(72) Inventors: Masafumi Mitsuishi, Kanagawa (JP); Masayasu Komyo, Kanagawa (JP); Souji Sunairi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/971,943

(22) Filed: Aug. 21, 2013

(65) Prior Publication Data

US 2014/0062595 A1      Mar. 6, 2014

(30) Foreign Application Priority Data

Sep. 4, 2012   (JP) .................................. 2012-194261

(51) Int. Cl.
| H03K 19/0175 | (2006.01) |
| H03K 19/094 | (2006.01) |
| H03F 3/45 | (2006.01) |
| H03F 1/52 | (2006.01) |
| H04L 25/02 | (2006.01) |

(52) U.S. Cl.
CPC ............ *H03F 3/45179* (2013.01); *H03F 1/523* (2013.01); *H03F 3/45188* (2013.01); *H03F 3/45632* (2013.01); *H04L 25/028* (2013.01); *H04L 25/0272* (2013.01)

(58) Field of Classification Search
None
See application file for complete search history.

(56) References Cited

U.S. PATENT DOCUMENTS

| 6,998,917 | B2 * | 2/2006 | Kudo et al. .................... 330/258 |
| 7,245,155 | B2 | 7/2007 | Watarai |
| 7,973,585 | B2 | 7/2011 | Kubo |
| 2009/0190648 | A1 | 7/2009 | Sakano et al. |
| 2013/0120020 | A1 * | 5/2013 | Li et al. ........................... 326/30 |

FOREIGN PATENT DOCUMENTS

| JP | 3764158 B2 | 1/2006 |
| JP | 2009-171403 A | 7/2009 |
| JP | 2010-283499 A | 12/2010 |

* cited by examiner

*Primary Examiner* — Anh Tran
(74) *Attorney, Agent, or Firm* — Mattingly & Malur, PC

(57) ABSTRACT

A highly reliable circuit is realized using the transistors having a lower withstand voltage. There are provided a differential pair including a first and a second transistor which respectively receive input signals having mutually reversed phases; a third and a fourth transistor respectively cascode-coupled to the first and the second transistor, and having the same conductivity type as the first and the second transistor; a first and a second output terminal coupled to respective drains of the third and the fourth transistor; and a voltage divider circuit which divides an intermediate potential between respective potentials of the first and the second output terminal and supplies the divided potential to gates of the third and the fourth transistor.

15 Claims, 24 Drawing Sheets

| VDDM | VDDL | EN | PD | PDB |
|------|------|-----|-----|-----|
| 1.8V | 1.0V | H | L | H |
| 1.8V | 1.0V | L | H | L |
| 1.8V | 0V | --- | H | L |
| 0V | --- | --- | L | L |

DIFFERENTIAL OUTPUT CIRCUIT AND SEMICONDUCTOR DEVICE

CROSS-REFERENCE TO RELATED APPLICATION

The disclosure of Japanese Patent Application No. 2012-194261 filed on Sep. 4, 2012 including the specification, drawings and abstract is incorporated herein by reference in its entirety.

BACKGROUND

The present invention relates to a differential output circuit and a semiconductor device, and for example, to bias supply technology of transistors in a differential output circuit and a semiconductor device.

There is a rising demand for increasing the speed of data transmission between LSI internal circuits, between LSIs, between printed circuit boards, or between devices forming an electronic apparatus. In order to meet such a demand, output circuits which output differential signals in data transmission use low voltage transistors to realize a higher speed and lower power consumption. Although low voltage transistors operate at high speed, they have low durability against an excess voltage applied on elements.

Therefore, Japanese Patent No. 3764158 (Patent Document 1), for example, discloses an output circuit having a differential pair having a first transistor and a second transistor which respectively receive a first input voltage and a second input voltage; a first cascode transistor cascode-coupled to the first transistor; a second cascode transistor cascode-coupled to the second transistor; a first resistor component coupled to a ground line; and a second resistor component coupled to a power supply line, a gate of the first cascode transistor and a gate of the second cascode transistor being coupled to each other, each of the gates having supplied thereto a bias of an potential determined by dividing the resistive voltage between the first resistor component and the second resistor component, the first transistor outputting a first output signal via the first cascode transistor, the second transistor outputting a second output signal via the second cascode transistor. According to such an output circuit, it becomes possible to prevent destruction of a low voltage transistor in a data output circuit using low voltage transistors, even when excess voltage is applied to the circuit during circuit operation.

In addition, Japanese Patent Laid-Open No. 2010-283499 (Patent Document 2) also discloses a driver circuit similarly to Patent Document 1.

Furthermore, Japanese Patent Laid-Open No. 2009-171403 (Patent Document 3) discloses a differential transmitter which outputs a differential signal via a pair of differential signal lines, the differential transmitter having an input differential pair including a first and a second transistor coupled in common at one end respectively thereof and operating with a load of a termination resistor at a side of a receiving unit coupled via the differential signal line; a tail current supplying a constant current to the input differential pair; and an impedance regulation unit provided between the input differential pair and the differential signal lines to regulate load impedance of the first and the second transistor.

SUMMARY

Related art will be analyzed in the following.

According to Patent Documents 1 and 2, a bias resulting from dividing the power supply voltage is provided to the gates of the first and the second cascode transistors.

Meanwhile, for an output circuit outputting differential signals in an HDMI (High Definition Multimedia Interface) or the like, a circuit is used whose output circuit functions as an open-drain CML (Current Mode Logic) circuit. In this case, the power supply described in Patent Documents 1 and 2 does not exist and thus it becomes difficult to provide the gates of the first and the second cascode transistors with a bias resulting from dividing the power supply voltage. On the other hand, although Patent Document 3 discloses an open-drain CML circuit, there is no technique disclosed to appropriately provide the transistor with a bias. Therefore, bias is not appropriately provided to a transistor according to conventional art, making it difficult to realize a highly reliable circuit using the transistors having a lower withstand voltage.

The other problems and the new feature will become clear from the description of the present specification and the accompanying drawings.

According to one embodiment, a differential output circuit has a differential pair including a first and a second transistor which respectively receive input signals having mutually reversed phases; a third and a fourth transistor respectively cascode-coupled to the first and the second transistor, and having the same conductivity type as the first and the second transistor; a first and a second output terminal coupled to respective drains of the third and the fourth transistor; and a voltage divider circuit which divides an intermediate potential between respective potentials of the first and the second output terminal and supplies the divided potential to gates of the third and the fourth transistor.

According to another embodiment, the semiconductor device has a first and a second transistor which respectively receive input signals having mutually reversed phases; a current supply coupled in common to sources of the first and the second transistor; a third and fourth transistor respectively cascode-coupled to the first and the second transistor, and having the same conductivity type as the first and the second transistor; a first and a second output terminal coupled to respective drains of the third and the fourth transistor; and an isolation well provided at a lower part of a diffusion region forming the first to the fourth transistor, provided with an intermediate potential between respective potentials of the first and the second output terminal, and having the same conductivity type as the first to the fourth transistor.

According to yet another embodiment, a differential output circuit has two output terminals; an open-drain CML circuit which drives the two output terminals; a reception detection circuit which receives at one end an intermediate potential between respective potentials of the two output terminals and is formed by including a plurality of vertically stacked transistors; and a voltage divider circuit which divides the intermediate potential between respective potentials of the two output terminals and outputs the divided potential, in which a transistor at a grounded side among the vertically stacked transistors receives at a gate thereof a detection permission signal for controlling whether or not to perform reception detection and outputs a reception detection signal from a source thereof, and the other transistors receive at gates thereof an output voltage of the voltage divider circuit.

According to another embodiment, a differential output circuit has two output terminals; an open-drain CML circuit which drives the two output terminals; two electrostatic protection circuits respectively coupled between each of the two output terminals and the ground and formed by including a plurality of vertically stacked transistors; and a voltage divider circuit which divides an intermediate potential between respective potentials of the two output terminals and outputs the divided potential, in which a transistor at a grounded side among the vertically stacked transistors has a gate thereof grounded, and the other transistors receive at gates thereof a potential resulted from dividing an output voltage of the voltage divider circuit.

According to yet another embodiment, a differential output circuit has two output terminals; an open-drain CML circuit which drives the two output terminals; a termination circuit coupled between the two output terminals and formed by a series circuit of termination resistors and a switching element; and a control circuit including a plurality of vertically stacked transistors with a power of an intermediate potential between respective potentials of the two output terminals, with a transistor at a grounded side among the vertically stacked transistors receiving at a gate thereof a control signal for opening and closing of the switching element, and with the other transistors receiving at gates thereof a potential resulted from dividing the intermediate potential between respective potentials of the two output terminals, the control circuit controlling opening and closing of the switching element based on a drain voltage of a transistor located farthest from the grounded side among the other transistors.

In addition, according to still another embodiment, a differential output circuit has a differential pair including a first and a second transistor which respectively receive input signals having mutually reversed phases; a third and a fourth transistor respectively cascode-coupled to the first and the second transistor, and having the same conductivity type as the first and the second transistor; a fifth transistor forming a current supply in the differential pair and having the same conductivity type as the first and the second transistor; a first and a second output terminal coupled to respective drains of the third and the fourth transistor; a first to a fifth conductive element conductively coupled between respective gates and drains of each of the first to the fifth transistors; two buffer circuits which supply the two respective input signals to respective gates of the first and the second transistor; and a power supply circuit which lowers a first power supply voltage and supplies the lowered voltage to the two buffer circuits as a second power supply voltage, in which the first to the fifth conductive element become conductive when at least the first power supply voltage is not supplied.

According to one embodiment, providing transistors with an appropriate bias makes it possible to realize a highly reliable circuit using transistors with a lower withstand voltage.

DETAILED DESCRIPTION

Figure 1:
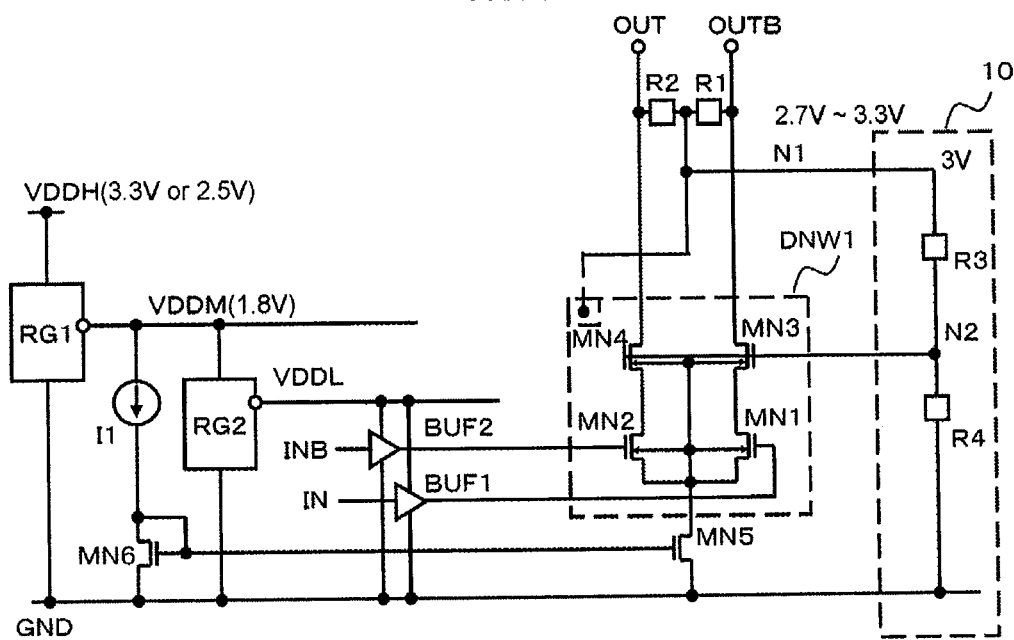
FIG. 1 is a circuit diagram of a differential output circuit according to a First Embodiment.

In the following, embodiments will be generally described. The drawings provided with reference numerals appearing in the general description below are only illustrative to help understanding the invention and not intended to limit the invention to illustrated aspects.

A differential output circuit according to a preferred embodiment has a differential pair including a first and a second transistor (MN1 and MN2 of FIG. 1) which respectively receive input signals (IN and INB of FIG. 1) having mutually reversed phases; a third and a fourth transistor (MN3 and MN4 of FIG. 1) respectively cascode-coupled to the first and the second transistor, and having the same conductivity type as the first and the second transistor; a first and a second output terminal (OUTB and OUT of FIG. 1) coupled to respective drains of the third and the fourth transistor; and a voltage divider circuit (10 of FIG. 1) which divides an intermediate potential between respective potentials of the first and the second output terminals and supplies the divided potential to gates of the third and the fourth transistor.

According to the differential output circuit such as that described above, the intermediate potential between respective potentials of the first and the second output terminals is divided and provided to the gates of the third and the fourth transistor as a bias. Therefore, the transistors can be provided with an appropriate bias, so that a highly reliable circuit can be realized using the transistors having a lower withstand voltage.

Figure 6:
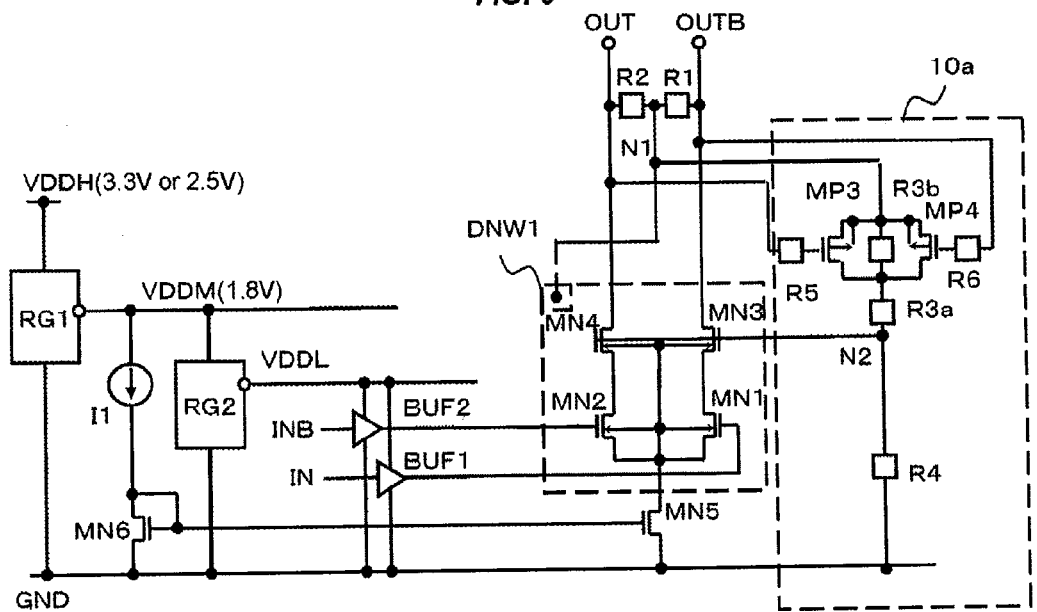
FIG. 6 is a circuit diagram of a Modification 3 of the differential output circuit according to the First Embodiment.

In the differential output circuit, the voltage divider circuit may be configured to change the voltage dividing ratio when the potential of either the first or the second output terminal is within a predetermined range (10a of FIG. 6).

The differential output circuit may further have two buffer circuits (BUF1 and BUF2 of FIG. 1) which supply the two respective input signals to respective gates of the first and the second transistor, and a power supply circuit (RG2 of FIG. 1) which lowers a first power supply voltage and supplies the lowered voltage to the two buffer circuits as a second power supply voltage.

Figure 7:
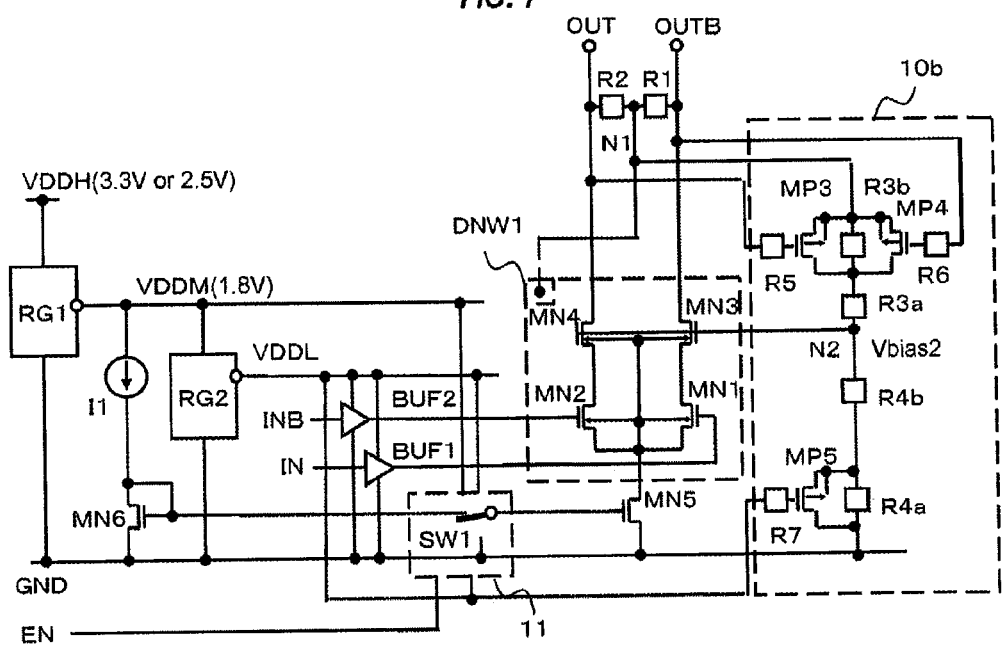
FIG. 7 is a circuit diagram of a Modification 4 of the differential output circuit according to the First Embodiment.

In the differential output circuit, the voltage divider circuit may be configured to change the voltage dividing ratio when the second power supply voltage is within a predetermined range (10b of FIG. 7).

In the differential output circuit, a current supply (MN5 of FIG. 7) forming a differential pair may be activated when the first power supply voltage is within a predetermined range.

In the differential output circuit, the current supply may be deactivated when the second power supply voltage is not output from the power supply circuit.

In the differential output circuit, the two buffer circuits may be respectively AC-coupled (through C1 and C2 of FIG. 9) to respective gates of the first and the second transistor so as to provide respective gates of the first and the second transistor with input signals which are offset by an amount of the second power supply voltage.

The semiconductor device according to another preferred embodiment has a first and a second transistor which respectively receive input signals having mutually reversed phases; a current supply coupled in common to sources of the first and the second transistor; a third and fourth transistor respectively cascode-coupled to the first and the second transistor, and having the same conductivity type as the first and the second transistor; a first and a second output terminal coupled to respective drains of the third and the fourth transistor; and an isolation well (DNW1 of FIGS. 1 and 2) provided at a lower part of a diffusion region forming the first to the fourth transistor, provided with an intermediate potential between respective potentials of the first and the second output terminal, and having the same conductivity type as the first to the fourth transistor.

According to the semiconductor device such as that described above, the intermediate potential between respective potentials of the first and the second output terminal is divided and provided to the isolation well as a bias. Therefore, the transistors can be provided with an appropriate bias, so that a highly reliable circuit can be realized using the transistors having a lower withstand voltage.

In the semiconductor device, the isolation well may have a structure to isolate a first well (PW3 of FIG. 4) forming the first and the second transistor from a second well (PW4 of FIG. 4) forming the third and the fourth transistor.

The semiconductor device may further include a first resistance element (R10 of FIG. 4) coupled between the first and the second wells.

The semiconductor device may further include a second and a third resistance elements (R11 and R12 of FIG. 4) coupled between the second well and respective sources of the third and the fourth transistor.

The semiconductor device may further have a voltage divider circuit which divides the intermediate potential and supplies the divided potential to gates of the third and the fourth transistor.

A differential output circuit according to yet another preferred embodiment has two output terminals (OUT and OUTB of FIG. 11); an open-drain CML circuit (20 of FIG. 11) which drives the two output terminals; a reception detection circuit (21 of FIG. 11) which receives at one end an intermediate potential between respective potentials of the two output terminals and is formed by including a plurality of vertically stacked transistors; and a voltage divider circuit (10d of FIG. 11) which divides the intermediate potential between respective potentials of the two output terminals and outputs the divided potential, in which a transistor at a grounded side (MN8 of FIG. 11) among the vertically stacked transistors receives at a gate thereof a detection permission signal for controlling whether or not to perform reception detection and outputs a reception detection signal from a source thereof, and the other transistors (MN7 of FIG. 11) receive at gates thereof an output voltage of the voltage divider circuit.

According to the differential output circuit such as that described above, the intermediate potential between respective potentials of two output terminals is divided and provided to the gates of the transistors other than the transistor at the grounded side among the vertically stacked transistors forming the reception detection circuit. Therefore, the transistors can be provided with an appropriate bias, so that a highly reliable circuit can be realized using the transistors having a lower withstand voltage.

In the differential output circuit, the voltage divider circuit may be configured to change the voltage dividing ratio when a potential of either one of the two output terminals is within a predetermined range.

A differential output circuit according to another preferred embodiment has two output terminals (OUT and OUTB of FIG. 12); an open-drain CML circuit (20 of FIG. 12) which drives the two output terminals; two electrostatic protection circuits (22a and 22b of FIG. 12) respectively coupled between each of the two output terminals and the ground and formed by including a plurality of vertically stacked transistors; and a voltage divider circuit (10d of FIG. 12) which divides an intermediate potential between respective potentials of the two output terminals and outputs the divided potential, in which a transistor at a grounded side (MN22 of FIGS. 13A and 13B) among the vertically stacked transistors has a gate thereof grounded, and the other transistors (MN23 of FIGS. 13A and 13B) receive at gates thereof a potential resulted from dividing an output voltage of the voltage divider circuit.

According to the differential output circuit such as that described above, the intermediate potential between respective potentials of the two output terminals is divided and provided to the gates of the transistors other than the transistor at the grounded side among the vertically stacked transistors forming the electrostatic protection circuit. Therefore, the transistors can be provided with an appropriate bias, so that a highly reliable circuit can be realized using the transistors having a lower withstand voltage.

In the differential output circuit, the electrostatic protection circuit may include a thyristor (Q21 and Q22 of FIG. 13B) coupled between the output terminal and the ground so that opening and closing of the thyristor is controlled based on a drain voltage of a transistor located farthest from the grounded side among the vertically stacked transistors.

In the differential output circuit, the voltage divider circuit may be configured to change the voltage dividing ratio when the potential of either one of the two output terminals is within a predetermined range.

A differential output circuit according to yet another preferred embodiment has two output terminals (OUT and OUTB of FIG. 15); an open-drain CML circuit which drives the two output terminals; a termination circuit (60 of FIG. 15) coupled between the two output terminals and formed by a series circuit of termination resistors (R61 and R62 of FIG. 15) and a switching element (MP61 of FIG. 15); and a control circuit (61 of FIG. 15) including a plurality of vertically stacked transistors with a power supply of an intermediate potential between respective potentials of the two output terminals, with a transistor (MN61 of FIG. 15) at the grounded side among the vertically stacked transistors receiving at a gate thereof a control signal for opening and closing of the switching element, and with the other transistors (MN62 of FIG. 15) receiving at gates thereof a potential resulted from dividing the intermediate potential between respective potentials of the two output terminals, the control circuit controlling opening and closing of the switching element based on a drain voltage of a transistor located farthest from the grounded side among the other transistors.

According to the differential output circuit such as that described above, the intermediate potential between respective potentials of the two output terminals is divided and provided to the gates of the transistors other than the transistor at the grounded side among the vertically stacked transistors forming the control circuit. Therefore, the transistors can be provided with an appropriate bias, so that a highly reliable circuit can be realized using the transistors having a lower withstand voltage.

In the differential output circuit, the control circuit may have a power supply circuit (62 of FIG. 15) which retrieves and outputs an intermediate potential; a load circuit (64 of FIG. 15) coupled at one end to the output of the power supply circuit and coupled at the other end to the control end of the switching element; and a voltage divider circuit (63 of FIG. 15) which divides and outputs the potential at one end or the other end of the load circuit, in which the vertically stacked transistors may be coupled at one end respectively thereof to the other end of the load circuit and grounded at the other end respectively thereof, and other transistors may receive at gates thereof the output signal of the voltage divider circuit.

The differential output circuit may further have a potential relaxation circuit (65 of FIG. 15) which generates a potential difference between one ends of the vertically stacked transistors and the other end of the load circuit.

In the differential output circuit, the switching element may be formed by a MOS transistor to which the intermediate potential is provided at a back gate thereof.

A differential output circuit according to still another preferred embodiment has a differential pair including a first and a second transistor (MN1 and MN2 of FIG. 23) which respectively receive input signals having mutually reversed phases; a third and a fourth transistor (MN3 and MN4 of FIG. 23) respectively cascode-coupled to the first and the second transistor, and having the same conductivity type as the first and the second transistor; a fifth transistor (MN5 of FIG. 23) forming a current supply in the differential pair and having the same conductivity type as the first and the second transistor; a first and a second output terminal (OUTB and OUT of FIG. 23) coupled to respective drains of the third and the fourth transistor; a first to a fifth conductive elements (MP72, MP71, MN72, MN71, and MP73) conductively couple between respective gates and drains of each of the first to the fifth transistors; two buffer circuits (BUF1 and BUF2 of FIG. 23) which supply the two respective input signals to respective gates of the first and the second transistor; and a power supply circuit (RG2 of FIG. 23) which lowers a first power supply voltage (VDDM of FIG. 23) and supplies the lowered voltage to the two buffer circuits as a second power supply voltage (VDDL of FIG. 23), in which the first to the fifth conductive element become conductive when at least the first power supply voltage is not supplied.

The differential output circuit may further have a control circuit (61 of FIG. 23) including a plurality of vertically stacked transistors with a power supply of an intermediate potential between respective potentials of the two output terminals, with a transistor at a grounded side among the vertically stacked transistors receiving at a gate thereof the first power supply voltage, and with the other transistors receiving at gates thereof a potential resulted from dividing the intermediate potential between respective potentials of the two output terminals, the control circuit controlling the conductivity state of the first and the second conductive elements based on a drain voltage of a transistor located farthest from the grounded side among the other transistors.

The differential output circuit may have a first and a second resistance element (R72 and R71 of FIG. 23) coupled between respective gates of the third and the fourth transistor and the first power supply voltage, and the first to the fifth conductive elements may be respectively formed by MOS transistors which are turned on when the first power supply voltage is not supplied.

Figure 24:
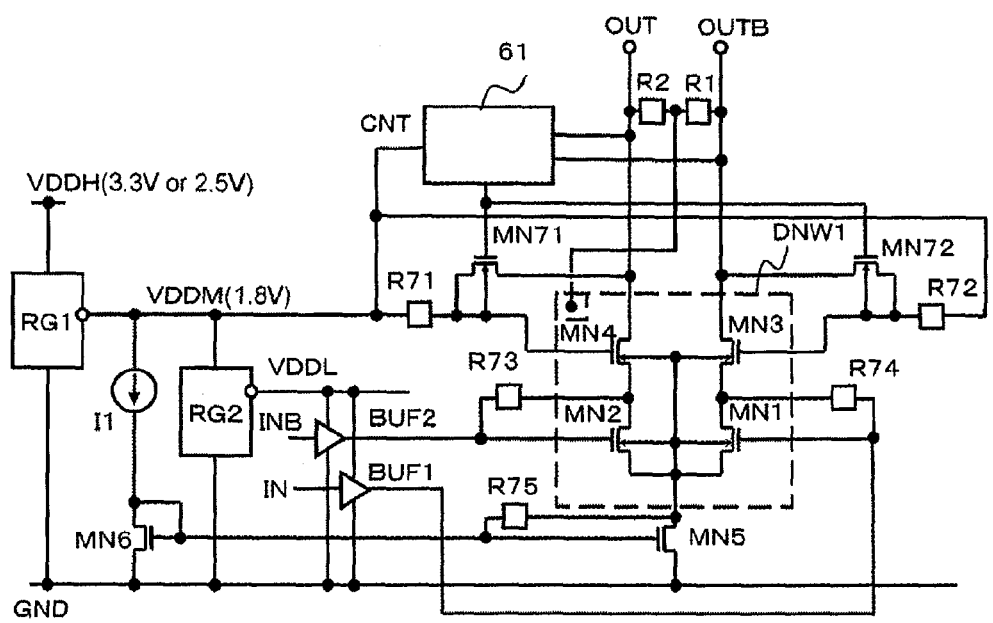
FIG. 24 is a circuit diagram of a modification of the differential output circuit according to the Fifth Embodiment.

The differential output circuit may have a first and a second resistance element (R72 and R71 of FIG. 24) coupled between respective gates of the third and the fourth transistor and the first power supply voltage, the third and the fourth conductive elements may be respectively formed by MOS transistors (MN72 and MN71 of FIG. 24) which are turned on when the first power supply voltage is not supplied, and the first, the second, and the fifth conductive elements may be respectively formed by resistance elements (R74, R73, and R75 of FIG. 24).

In the following, detailed description will be provided according to more specific embodiments, referring to the drawings.

[First Embodiment]

FIG. 1 is a circuit diagram of a differential output circuit according to a First Embodiment. In FIG. 1, the differential output circuit has regulators RG1 and RG2, buffer circuits BUF1 and BUF2, output terminals OUT and OUTB, a current supply I1, NMOS transistors MN1 to MN6, and resistance elements R1 to R4.

The regulator RG1 lowers the voltage (e.g., 3.3 or 2.5 V) of the power supply VDDH and outputs the power supply VDDM (e.g., 1.8 V). The regulator RG2 lowers the voltage of the power supply VDDM and outputs the power supply VDDL (e.g., 1.0 V).

The buffer circuits BUF1 and BUF2 operate at the power supply VDDL, respectively buffer the input signals IN and INB, and supply them to the gates of the NMOS transistors MN1 and MN2, respectively. Here, the input signals IN and INB are input signals having mutually reversed phases.

The NMOS transistors MN5 and MN6 form a current mirror, in which a current having the same value as the current of the current supply I1 supplied to the drain of the NMOS transistor MN6 flows in the NMOS transistor MN5 which becomes a current supply.

The NMOS transistors MN1 and MN2 have sources coupled in common to the drain of the NMOS transistor MN5 to form a differential pair.

The NMOS transistors MN3 and MN4, are respectively cascode-coupled to the NMOS transistors MN1 and MN2, and couple respective drains thereof to the output terminals OUTB and OUT.

A series circuit of the resistance elements R1 and R2 are coupled between the output terminals OUTB and OUT. A midpoint node N1 of the series circuit of the resistance elements R1 and R2 is coupled to the other end of the series circuit of the resistance elements R3 and R4, one end of which is grounded. Here, the resistance elements R3 and R4 form the voltage divider circuit 10.

A midpoint node N2 of the series circuit of the resistance elements R3 and R4 is coupled to the gates of the NMOS transistors MN3 and MN4.

The back gates of the NMOS transistors MN1 to MN4 are coupled in common to the sources of the NMOS transistors MN1 and MN2.

An N-type isolation well (deep N well) DNW1 provided at a lower part of the back gates of the NMOS transistors MN1 to MN4 is coupled to the node N1.

Figure 2:
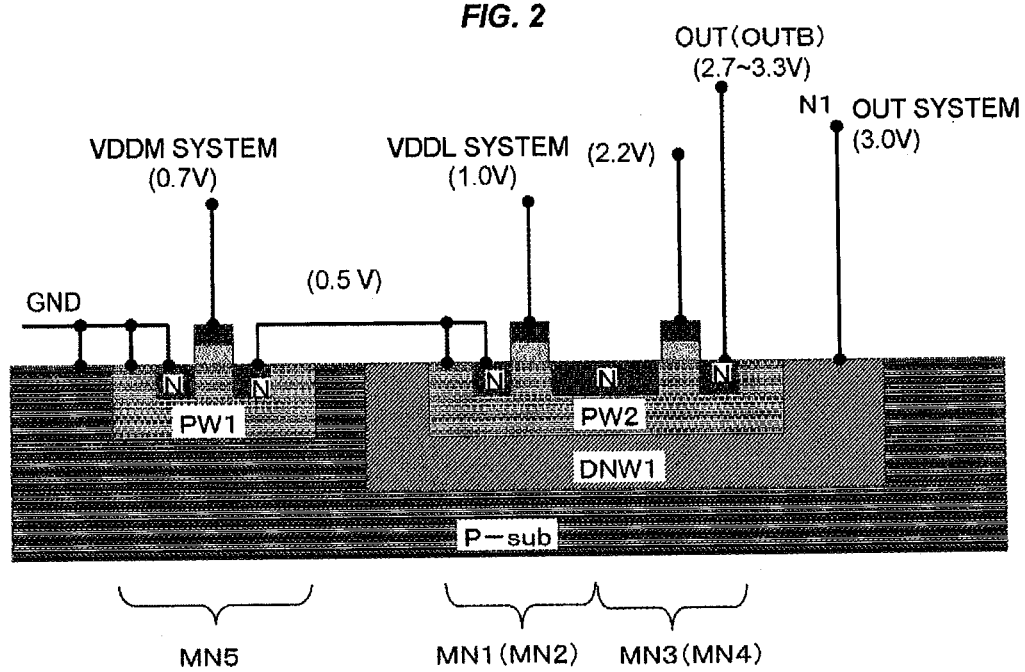
FIG. 2 is a cross sectional view schematically illustrating a configuration of a semiconductor device according to the First Embodiment.

Next, a semiconductor device having the differential output circuit such as that described above formed therein will be described. FIG. 2 is a cross sectional view schematically illustrating a configuration of the semiconductor device according to the First Embodiment. In FIG. 2, the semiconductor device has formed therein a P-type well PW1 and an N-type isolation well DNW1 on a P-type substrate P-sub.

The P-type well PW1 which will become the back gate of the NMOS transistor MN5 has formed therein an N-type diffusion layer to become the source and the drain of the NMOS transistor MN5 respectively, and a gate electrode of the NMOS transistor MN5 is provided on the upper part of the P-type well PW1 between the two N-type diffusion layers.

In the isolation well DNW1, a P-type well PW2 is provided to become the back gates of the NMOS transistors MN1 to MN4, respectively. The P-type well PW2 has formed therein an N-type diffusion layer to become respective sources of the NMOS transistors MN1 and MN2, an N-type diffusion layer to become respective drains of the NMOS transistors MN1 and MN2 and respective sources of the NMOS transistor MN3 and MN4, and an N-type diffusion layer to become respective drains of the NMOS transistors MN3 and MN4.

On the upper part of the P-type well PW2 between the two N-type diffusion layers forming the NMOS transistor MN1 (MN2), a gate electrode of the NMOS transistor MN1 (MN2) is provided. On the upper part of the P-type well PW2 between the two N-type diffusion layers forming the NMOS transistor MN3 (MN4), a gate electrode of the NMOS transistor MN3 (MN4) is provided.

In the differential output circuit configured as described above, the voltage of the output terminals OUTB and OUT become 2.7 to 3.3 V with power supply from the receiving side, referring to an HDMI (High Definition Multimedia Interface) as an example. In addition, respective potentials of the nodes N1 and N2 become about 3.05 V and 1.8 V. Therefore, the voltage between respective gates and drains of the NMOS transistors MN3 and MN4 becomes 0.9 to 1.5 V, and the voltage between respective gates and drains and between respective sources and gates of the NMOS transistors MN1 and MN2 becomes equal to or lower than 0.9 V.

When, on the one hand, a cable is unplugged from the receiving side, or power supply from the receiving side is interrupted due to failure of power source of the receiving side, the voltage of the output terminals OUTB and OUT, and the nodes N1 and N2 becomes 0 V. Therefore, the voltages between respective gates and drains and between respective sources and gates of the NMOS transistors MN1 and MN2 are equal to or lower than 0.9 V.

When, on the other hand, the power supply VDDH becomes 0 V while power is being supplied from the receiving side, the potential at the node N2 becomes about 1.8V. In addition, since the power supplies VDDM and VDDL are also 0 V, the NMOS transistors MN1, MN2, and MN5 are turned off. Therefore, the voltage between respective electrodes in the NMOS transistors MN1 to MN5 is lower than 1.8 V.

As described above, the voltage between respective electrodes in the NMOS transistors MN1 to MN5 becomes lower than 1.8 V regardless of the state of power supply. Therefore, a low voltage transistor of lower than 1.8 V can be used.

In addition, referring to FIG. 2, wiring for cascode-coupling is unnecessary because the P-type well PW2 is provided in common to the NMOS transistors MN1 to MN4. Therefore, there is little stray capacitance associated with wiring or the like, which is advantageous for realizing a higher speed.

[Modification ]1

Figure 3:
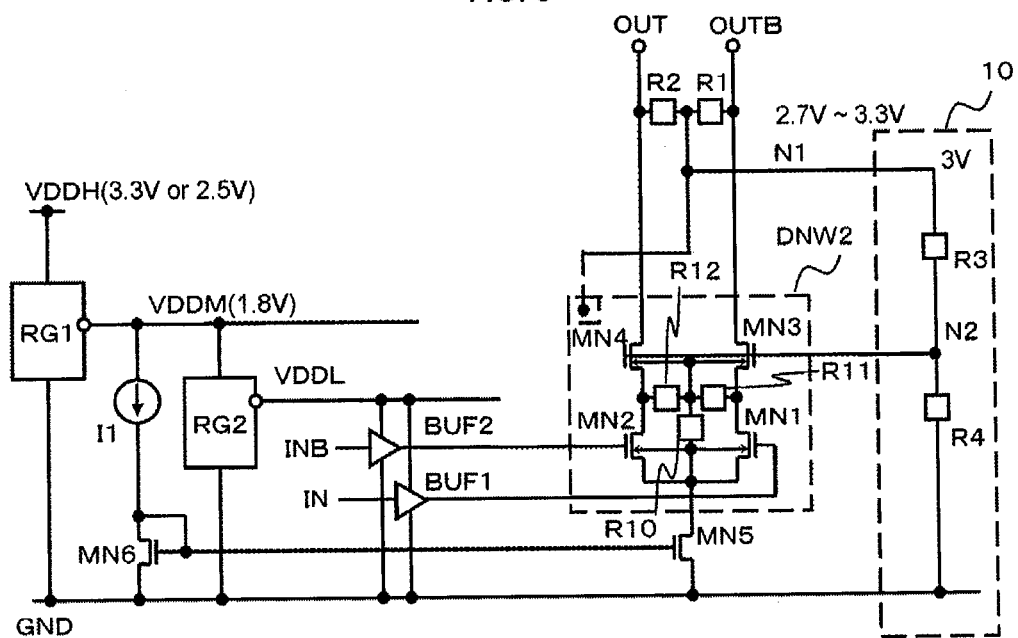
FIG. 3 is a circuit diagram of a Modification 1 of the differential output circuit according to the First Embodiment.

FIG. 3 is a circuit diagram of a Modification 1 of the differential output circuit according to the First Embodiment. In FIG. 3, the same reference numerals as those in FIG. 1 indicate the same portions, and description thereof is omitted. The NMOS transistors MN3 and MN4, having a common back gate, are coupled to the back gates of the NMOS transistors MN1 and MN2 via a resistance element R10, and coupled to respective sources of the NMOS transistors MN3 and MN4 via resistance elements R11 and R12 respectively.

Figure 4:
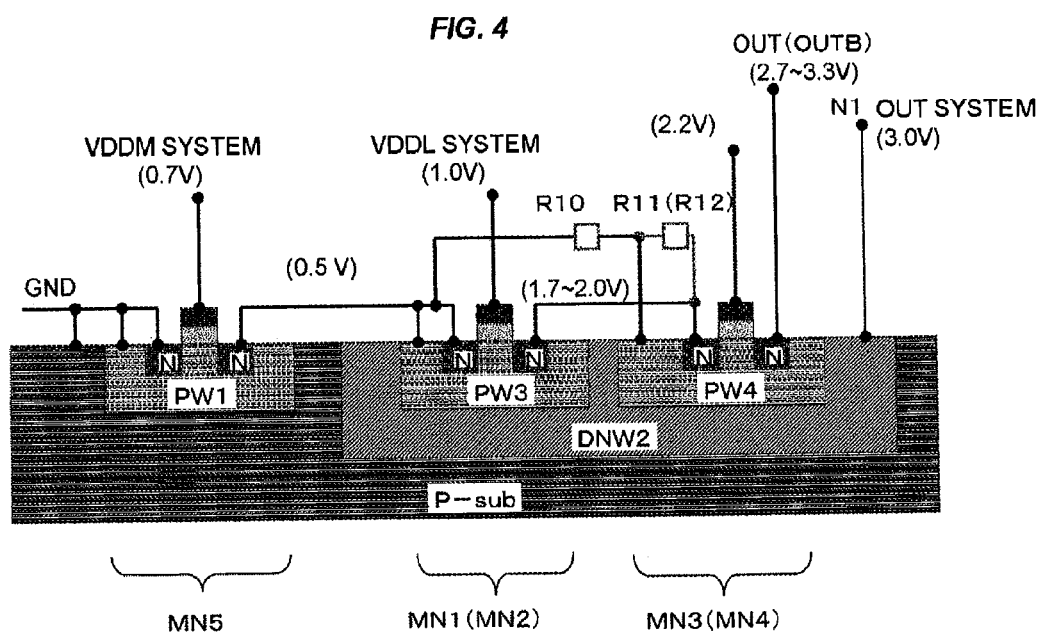
FIG. 4 is a cross sectional view schematically illustrating a configuration of a semiconductor device according to the Modification 1.

Next, a semiconductor device having formed therein a differential output circuit of the Modification 1 such as that described above will be described. FIG. 4 is a cross sectional view schematically illustrating a configuration of the semiconductor device according to the Modification 1. In FIG. 4, the same reference numerals as those in FIG. 2 indicate the same portions, and description thereof is omitted. The semiconductor device illustrated in FIG. 4 has an N-type isolation well DNW2 in place of the N-type isolation well DNW1 of FIG. 2. The isolation well DNW2 has provided therein, in an isolated manner, a P-type well PW3 to become the back gates of the NMOS transistors MN1 and MN2, respectively, and a P-type well PW4 to become the back gates of the NMOS transistors MN3 and MN4, respectively.

The P-type well PW3 has formed therein an N-type diffusion layer to become respective sources of the NMOS transistors MN1 and MN2, and an N-type diffusion layer to become respective drains of the NMOS transistors MN1 and MN2. The P-type well PW4 has formed therein an N-type diffusion layer to become respective sources of the NMOS transistors MN3 and MN4, and an N-type diffusion layer to become respective drains of the NMOS transistors MN3 and MN4.

In the differential output circuit configured as described above, the voltage between each two terminals among four terminals of the NMOS transistors MN1 to MN5, i.e., gate-source, gate-drain, gate-bulk, and source-drain is required to be equal to or lower than 1.8 V in the steady state. On the other hand, there is no problem with the potential difference between diffusion layers being 3.3 V. Therefore the configuration allows a potential of 3.3 V to be applied between the substrate P-sub and the isolation well DNW2, or the like. In the configuration illustrated in FIG. 4, the P-type wells PW3 and PW4 are provided in an isolated manner to have applied thereon separate bias voltages. By providing the wells in an isolated manner, static electricity applied to the output terminals OUTB and OUT is voltage-divided, which leads to improve electrostatic discharge (ESD) immunity.

[Modification]2

Figure 5A:
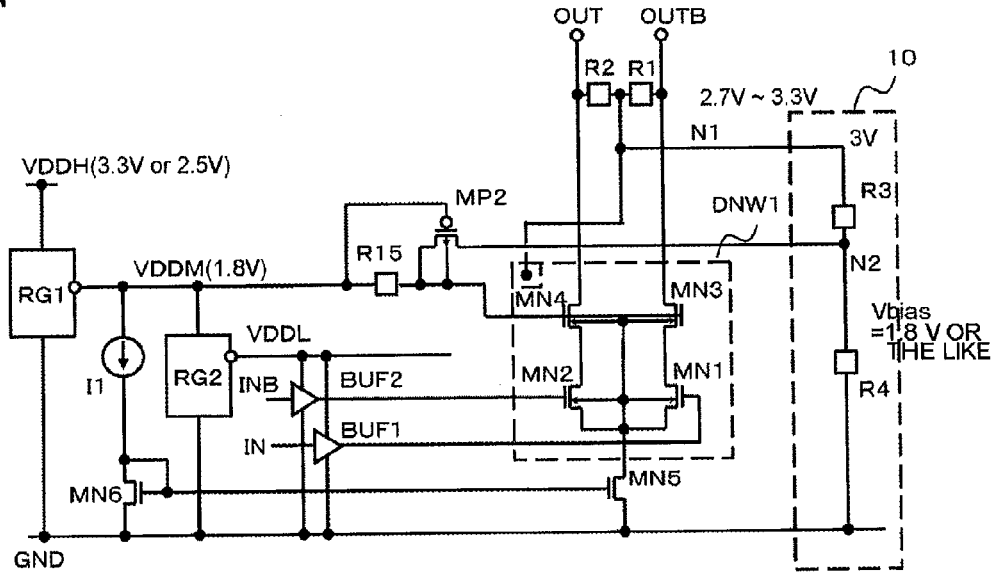
FIGS. 5A to 5C are circuit diagrams of a Modification 2 of the differential output circuit according to the First Embodiment.
Figure 5B:

FIGS. 5A to 5B are circuit diagrams of a Modification 2 of the differential output circuit according to the First Embodiment. In FIGS. 5A to 5B, the same reference numerals as those in FIG. 1 indicate the same portions, and description thereof is omitted. A resistance element R15 is coupled at one end to the power supply VDDM and coupled at the other end to the gates of the NMOS transistors MN3 and MN4. A PMOS transistor MP2 has its gate coupled to the power supply VDDM, its source coupled to the node N2, and its drain and back gate coupled to the gates of the NMOS transistors MN3 and MN4.

In the differential output circuit configured as described above, the bias of the gates of the NMOS transistors MN3 and MN4 is provided from the power supply VDDM via the resistance element R15 when the power supply VDDM is 1.8 V. When, on the other hand, the power supply VDDM is shut down (0 V), the PMOS transistor MP2 turns on and the bias of the gates of the NMOS transistors MN3 and MN4 is provided from the node N2.

Here, an NMOS transistor MN10 may be provided, in place of the resistance element R15 as illustrated in FIG. 5B, having its drain and gate coupled to the power supply VDDM and its source coupled to the gate of the NMOS transistors MN3 and MN4. In this case, the bias of the gates of the NMOS transistors MN3 and MN4 is provided from the power supply VDDM via the NMOS transistor MN10 which has turned on when the power supply VDDM is 1.8 V. When, on the other hand, the power supply VDDM is shut down (0 V), the NMOS transistor MN10 is turned off.

Figure 5C:
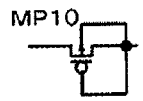

In addition, a PMOS transistor MP10 may be provided, in place of the resistance element R15, as illustrated in FIG. 5C, having its drain coupled to the power supply VDDM, and its source, gate, and back gate coupled to the gates of the NMOS transistors MN3 and MN4. In this case, the bias of the gates of the NMOS transistors MN3 and MN4 is provided from the power supply VDDM via the PMOS transistor MP10 which has turned on when the power supply VDDM is 1.8 V. When, on the other hand, the power supply VDDM is shut down (0 V), the PMOS transistor MP10 is turned off.

As thus described, the bias of the gates of the NMOS transistors MN3 and MN4 can also be configured not to be fixed to the node N2.

[Modification]3

FIG. 6 is a circuit diagram of a Modification 3 of the differential output circuit according to the First Embodiment. In FIG. 6, the same reference numerals as those in FIG. 1 indicate the same portions, and description thereof is omitted. In comparison with the voltage divider circuit 10 illustrated in FIG. 1, a voltage divider circuit 10a further has PMOS transistors MP3 and MP4, and resistance elements R5 and R6, and has resistance elements R3a and R3b coupled in series, in place of the resistance element R3 of FIG. 1.

The PMOS transistor MP3 (MP4) has the source and the back gate coupled to the node N1, the gate coupled to the output terminal OUT (OUTB) via the resistance element R5 (R6), and the drain coupled to the coupling point of the resistance elements R3a and R3b. The resistance element R5 (R6) operates to protect the gate of the PMOS transistor MP3 (MP4) against an excessive voltage that may be applied to the output terminal OUT (OUTB) from the outside.

In the differential output circuit configured as described above, it will be described on the assumption that one of the coupling sites of the output terminals OUTB and OUT is decoupled due to poor cabling with the receiving side. When the receiving side power supply is turned on, a voltage of a maximum of 3.3 V is generated at one of the output terminals OUTB and OUT, whereas the voltage at the other terminal drops to 0 V. In this case, the potential at the node N1 significantly drops to 1.65 V. Therefore, the bias voltage (potential at the node N2) supplied to the gates of the NMOS transistors MN3 and MN4 decreases. In order to prevent the drop, the PMOS transistors MP3 and MP4, upon detecting that either wiring of the output terminals OUTB or OUT has been decoupled, are turned on and operate so as to raise the potential at the node N2. In other words, the bias voltage (potential at the node N2) is raised by turning on one of the PMOS transistors MP3 or MP4 so that the voltage drop in the resistance element R3b becomes 0 V. Accordingly, it becomes possible to maintain the bias voltage and secure the withstand voltage of respective transistors, even if one side is decoupled and the potential of one of the output terminals OUTB and OUT has dropped to about 0 V.

[Modification]4

FIG. 7 is a circuit diagram of a Modification 4 of the differential output circuit according to the First Embodiment. In FIG. 7, the same reference numerals as those in FIG. 6 indicate the same portions, and description thereof is omitted. In comparison with the voltage divider circuit 10a illustrated in FIG. 6, the voltage divider circuit 10b further has a PMOS transistor MP5 and a resistance element R7, and has resistance elements R4a and R4b coupled in series, in place of the resistance element R4 of FIG. 6. In addition, a switching circuit 11 is provided between the gate of the NMOS transistor MN5 and the gate of the NMOS transistor MN6.

The PMOS transistor MP5 has the source and the back gate coupled to the coupling point of the resistance elements R4a and R4b, the gate coupled to the power supply VDDL via the resistance element R7, and the drain grounded. The resistance element R7 operates to protect the gate of the PMOS transistor MP5 against an excessive voltage which may be generated at the power supply VDDL.

The switching circuit 11, operating by the power supplies VDDM and VDDL, has a function of a switch (SW1) which switches between grounding the gate of the NMOS transistor MN5, or coupling it to the gate of the NMOS transistor MN6, according to the level of a regulator enable signal EN.

Figures 8A, 8B:
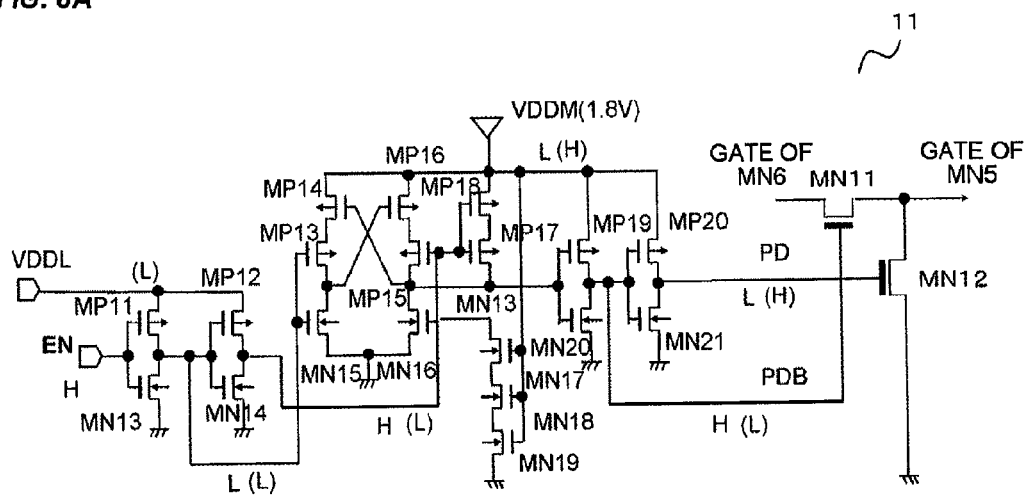
FIGS. 8A and 8B illustrate an exemplary circuit of a switching circuit and operation thereof.

Next, details of the switching circuit 11 will be described. FIG. 8A illustrates an exemplary circuit of switching circuit 11. The switching circuit 11 has NMOS transistors MN11 to MN21, and PMOS transistors MP11 to MP20.

The NMOS transistor MN13 and the PMOS transistor MP11, forming a CMOS inverter circuit operated by the power supply VDDL, invert the regulator enable signal EN and provide it to the gates of the NMOS transistor MN15 and the PMOS transistor MP13.

The NMOS transistor MN14 and the PMOS transistor MP12, forming a CMOS inverter circuit operated by the power supply VDDL, provide a signal in phase with the regulator enable signal EN to the gates of the PMOS transistors MP15, MP17, and MP18.

The PMOS transistor MP13 has its source coupled to the power supply VDDM via the PMOS transistor MP14, and its drain coupled to the drain of the NMOS transistor MN15 and the gate of the PMOS transistor MP18. The source of the NMOS transistor MN15 is grounded.

The PMOS transistor MP15 has its source coupled to the power supply VDDM via the PMOS transistor MP16, and its drain coupled to the drain of the NMOS transistor MN16 and the gate of the PMOS transistor MP14. The source of the NMOS transistor MN16 is grounded.

The PMOS transistor MP17 has its source coupled to the power supply VDDM via the PMOS transistor MP18, and its drain coupled to the drain of the NMOS transistor MN16.

The NMOS transistors MN19, MN18, and MN17 have their gates coupled to the power supply VDDM in common, which are coupled in a manner vertically stacked from the grounded side toward the gate of the NMOS transistor MN16.

The NMOS transistor MN20 and the PMOS transistor MP19, forming a CMOS inverter circuit operated by the power supply VDDM, invert a signal of the drain of the NMOS transistor MN16 and provide it to the gate of the NMOS transistor MN11 as a signal PDB.

The NMOS transistor MN21 and the PMOS transistor MP20, forming a CMOS inverter circuit operated by the power supply VDDM, invert the signal PDB and provide the inverted signal to the gate of the NMOS transistor MN12 as a signal PD.

The NMOS transistor MN11 is coupled between the drain and the gate of the NMOS transistor MN6, and the gate of the NMOS transistor MN5. The NMOS transistor MN12 is coupled between the gate of the NMOS transistor MN5 and the ground.

The switching circuit 11 configured as described above operates as illustrated in FIG. 8B, according to the voltage of the power supplies VDDM and VDDL and the level of the regulator enable signal EN. In other words, when the power supplies VDDM and VDDL are normally provided (at 1.8 V and 1.0 V, respectively), the regulator enable signal EN being at the H level results in signal PD="L" and signal PDB="H". Therefore, the NMOS transistor MN11 is turned on and the NMOS transistor MN12 is turned off, whereby the gate of the NMOS transistor MN5 is coupled to the drain and the gate of the NMOS transistor MN6. In other words, the current mirror formed by the NMOS transistors MN5 and MN6 is activated.

In addition, when the power supplies VDDM and VDDL are normally provided, the regulator enable signal EN being at the L level, or the power supply VDDM being at 1.8 V and the power supply VDDL being at 0 V results in signal PD="H" and signal PDB="L". Therefore, the NMOS transistor MN11 is turned off and the NMOS transistor MN12 is turned on, whereby the gate of the NMOS transistor MN5 is grounded.

Furthermore, the power supplies VDDM and VDDL being at 0 V results in signal PD="L" and signal PDB="L". Therefore, both the NMOS transistors MN11 and MN12 are turned off.

In other words, the NMOS transistor MN5 which will become the current supply forming a differential pair is activated when the power supplies VDDM and VDDL are in the normal state and the regulator enable signal EN is at the H level. When the regulator enable signal EN is at the L level, or the power supply VDDL is not in the normal state, the NMOS transistor MN5 is turned off (deactivated).

When, in the differential output circuit described above, the regulator enable signal EN drops to the L level and the power supply VDDL drops to 0 V, the NMOS transistors MN1, MN2, and MN5 are turned off. Furthermore, the PMOS transistor MP5 is turned on so that the resistance element R4a is short-circuited, whereby the potential at the node N2 is lowered. Therefore, the withstand voltage of the NMOS transistors MN1 to MN5 is supposed to be fulfilled.

[Modification]5

Figure 9:
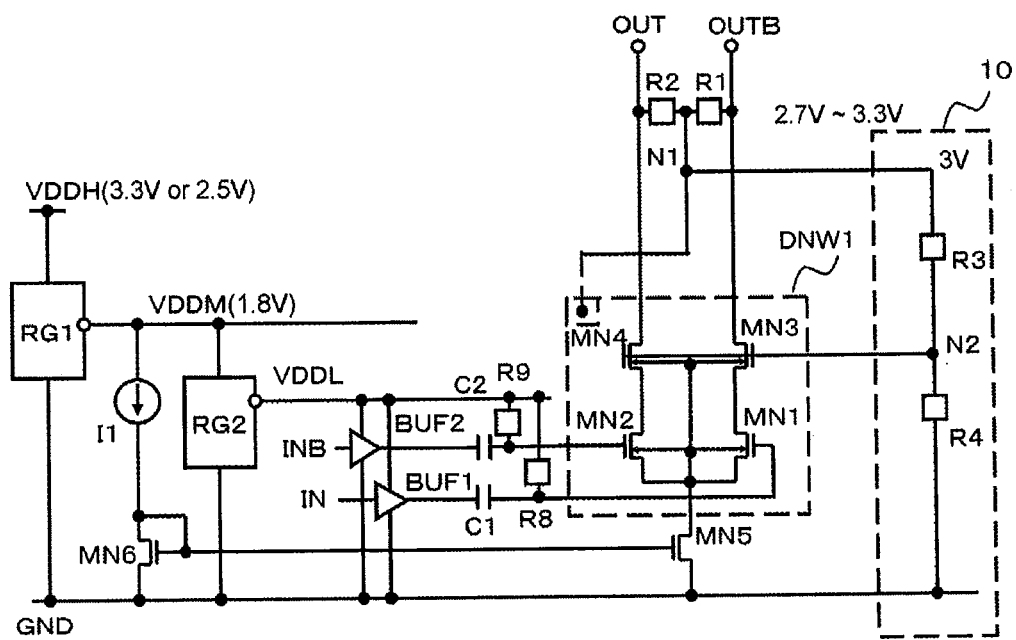
FIG. 9 is a circuit diagram of a Modification 5 of the differential output circuit according to the First Embodiment.

FIG. 9 is a circuit diagram of a Modification 5 of the differential output circuit according to the First Embodiment. In FIG. 9, the same reference numerals as those in FIG. 1 indicate the same portions, and description thereof is omitted. In comparison with FIG. 1, the differential output circuit illustrated in FIG. 9 has a capacity element C1 (C2) between the gate of the NMOS transistor MN1 (MN2) and the output of buffer circuit BUF1 (BUF2). In addition, a resistance element R8 (R9) is provided between the gate of the NMOS transistor MN1 (MN2) and the power supply VDDL.

According to the differential output circuit configured as described above, an output signal of the buffer circuit BUF1 (BUF2), which has been offset by an amount of the voltage of the power supply VDDL, is supplied to the gate of the NMOS transistor MN1 (MN2). Therefore, the bias voltage of the gates of the NMOS transistors MN1 and MN2 is raised, making it easier to secure an operation margin and a withstand voltage margin for the NMOS transistors MN1 to MN3.

[Modification]6

Figure 10:
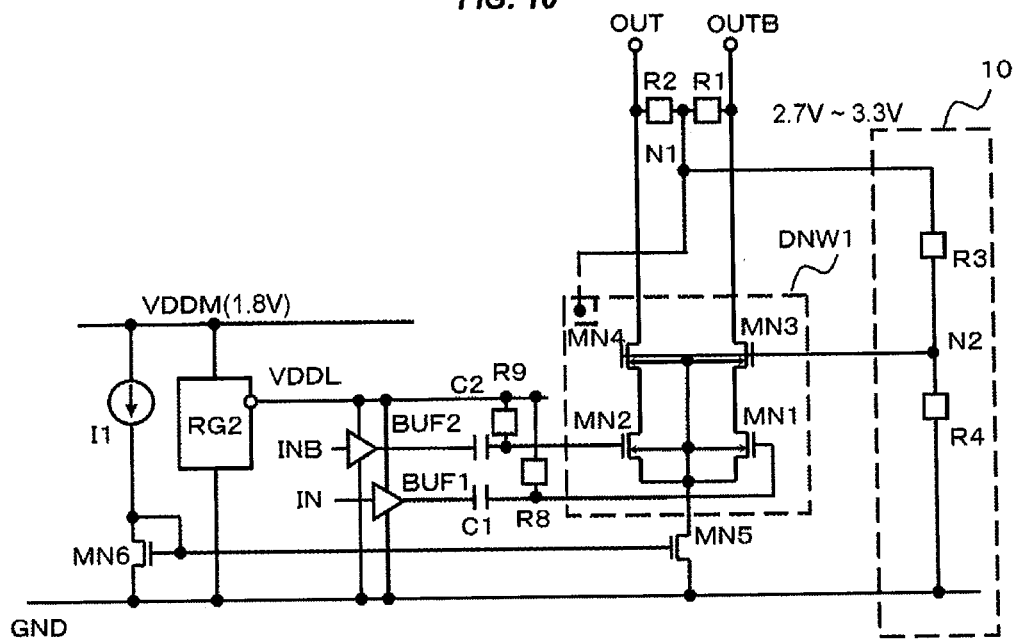
FIG. 10 is a circuit diagram of a Modification 6 of the differential output circuit according to the First Embodiment.

FIG. 10 is a circuit diagram of a Modification 6 of the differential output circuit according to the First Embodiment. In FIG. 10, the same reference numerals as those in FIG. 9 indicate the same portions, and description thereof is omitted. The differential output circuit illustrated in FIG. 10, with the regulator RG1 eliminated therefrom, has the power supply VDDM provided thereto directly from the outside. Also with such a configuration, it becomes possible to secure the withstand voltage of respective transistors, as previously described.

Although various modifications have been described above, it is needless to say that they may be combined in a variety of ways as long as their functions do not conflict with each other.

In the differential output circuit configured as described above, the gates of the NMOS transistors MN3 and MN4 have coupled thereto the node N2 of the voltage divider circuit 10 (10a, 10b) and are provided with a bias. Therefore, the NMOS transistors MN3 and MN4 can be provided with an appropriate bias, whereby a highly reliable circuit can be realized using the transistors having a lower withstand voltage.

[Second Embodiment]

Figure 11:
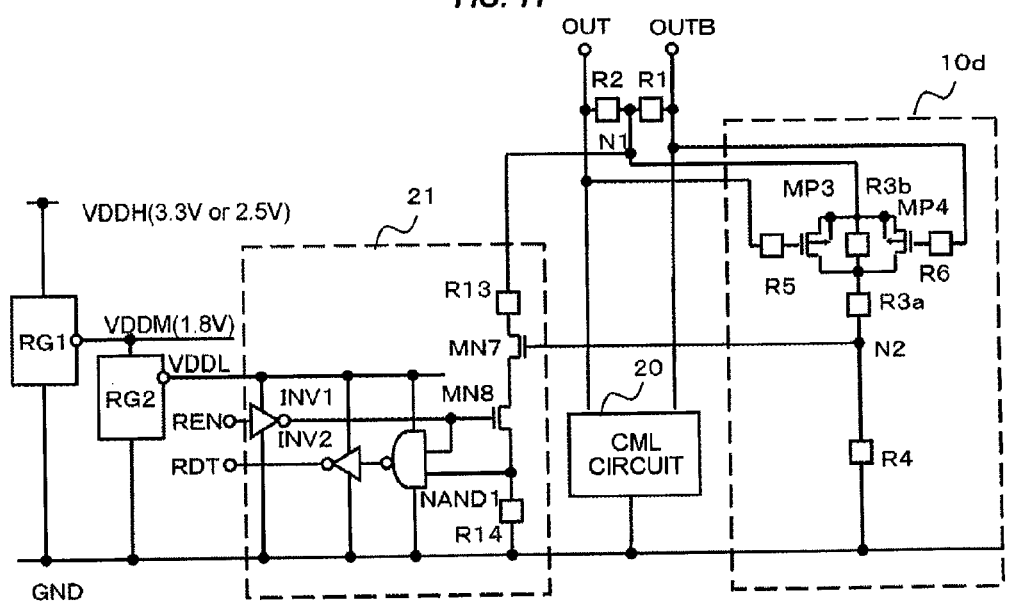
FIG. 11 is a circuit diagram of a differential output circuit according to a Second Embodiment.

Next, a reception detection circuit used for a differential output circuit will be described. FIG. 11 is a circuit diagram of a differential output circuit according to a Second Embodiment. In FIG. 11, the same reference numerals as those in FIG. 6 indicate the same portions, and description thereof is omitted. The differential output circuit illustrated in FIG. 11 further has a voltage divider circuit 10d and a reception detection circuit 21. Although it is preferred that a CML circuit 20 is an open-drain CML (Current Mode Logic) circuit which is similar to the differential output circuit according to the First Embodiment, it is not limited thereto as long as the withstand voltage of the transistors in the CML circuit 20 satisfies a desired condition.

The voltage divider circuit 10d has the same configuration as the voltage divider circuit 10a of FIG. 6. However, in the case where the CML circuit 20 has the voltage divider circuit 10a, as has been described with the embodiment 1, the voltage divider circuit 10d is provided separately with the voltage divider circuit 10a. This is because the voltage divider circuit 10a is provided specifically for biasing the NMOS transistors MN3 and MN4, and it is necessary to reduce the load of the node to raise tracking speed in a transient state immediately after a cable is plugged into or unplugged from the receiving side by a hot plug or the like. Therefore, it is preferred to provide the voltage divider circuit 10a specifically for biasing the NMOS transistors MN3 and MN4.

The reception detection circuit 21 has inverter circuits INV1 and INV2, a two-input NAND circuit NAND1, NMOS transistors MN7 and MN8, and resistance elements R13 and R14. The inverter circuits INV1 and INV2, and the NAND circuit NAND1 are provided with the power supply VDDL.

The NMOS transistor MN7 has its drain coupled to the node N1 via the resistance element R13, its gate coupled to the node N2, and its source coupled to the drain of the NMOS transistor MN8.

The NMOS transistor MN8 receives at a gate thereof a signal REN to be logically inverted by the inverter circuit INV1, and has the source thereof grounded via the resistance element R14. Here, the signal REN, when being at the L level, is a reception detection authorization signal which permits detecting whether or not power is supplied to the output terminals OUT and OUTB from the outside.

The NAND circuit NAND1, coupled at one input end to the output end of the inverter circuit INV1 and coupled at the other input end to the source of the NMOS transistor MN8, outputs the signal RDT from the output end via the inverter circuit INV2.

When, in the configuration as described above, the signal REN is at the H level, the gate of the NMOS transistor MN8 drops to the L level and the NMOS transistor MN8 is turned off. Therefore, the two inputs of the NAND circuit NAND1 drop to the L level, and the signal RDT drops to the L level.

In addition, when the signal REN is at the L level, the gate of the NMOS transistor MN8 becomes the H level and the NMOS transistor MN8 turns on. When power is supplied to the output terminals OUT and OUTB from the outside in this situation, the potential at the node N2 rises to turn on the NMOS transistor MN7, causing electric current to flow into the resistance element R14 so that the source of the NMOS transistor MN8 rises to the H level. Therefore, the signal RDT rises to the H level. In other words, the reception detection circuit 21 outputs a receivable state with the signal RDT="H".

When, on the other hand, the NMOS transistor MN8 is on and power is not supplied to the output terminals OUT and OUTB from the outside, the NMOS transistor MN7 turns off, preventing electric current from flowing into the resistance element R11 so that the source of the NMOS transistor MN8 drops to the L level. Therefore, the signal RDT drops to the L level. In other words, the reception detection circuit 21 outputs an unreceivable state with the signal RDT="L".

In the reception detection circuit 21 configured as described above, the NMOS transistors MN7 and MN8 are vertically stacked, and the gate of the NMOS transistor MN7 is coupled to the node N2 of the voltage divider circuit 10d, and is provided with a bias therefrom. Therefore, the NMOS transistor MN7 can be provided with an appropriate bias, whereby a highly reliable circuit can be realized using the transistors having a lower withstand voltage.

[Third Embodiment]

Figure 12:
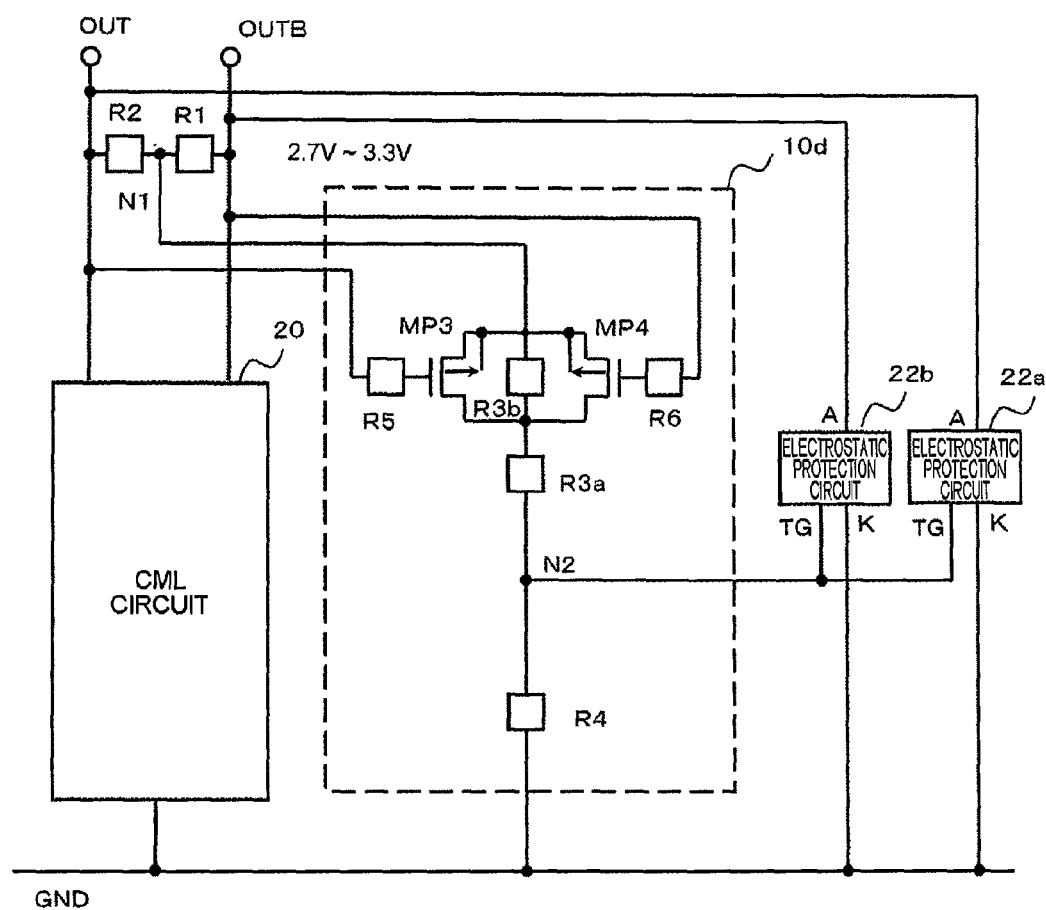
FIG. 12 is a circuit diagram of a differential output circuit according to a Third Embodiment.

Next, an electrostatic protection circuit used for a differential output circuit will be described. FIG. 12 is a circuit diagram of a differential output circuit according to a Third Embodiment. In FIG. 12, the same reference numerals as those in FIG. 11 indicate the same portions, and description thereof is omitted. The differential output circuit illustrated in FIG. 12 further has electrostatic protection circuits 22a and 22b. The electrostatic protection circuits 22a and 22b have an anode A coupled to the output terminals OUT and OUTB respectively, a cathode K grounded, and a trigger gate TG coupled to the node N2.

Figure 13A:
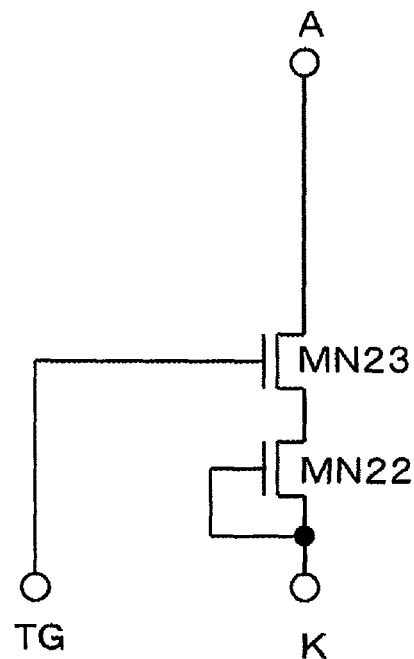
FIGS. 13A and 13B illustrate an exemplary circuit diagram of an electrostatic protection circuit.
Figure 13B:
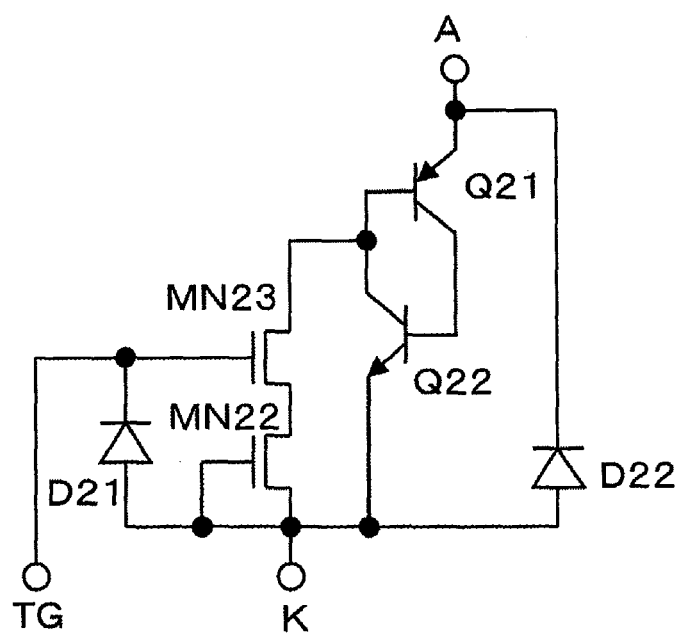

Next, details of the electrostatic protection circuits 22a and 22b will be described. FIGS. 13A and 13B illustrate an exemplary circuit diagram of the electrostatic protection circuits 22a and 22b.

In FIG. 13A, the electrostatic protection circuit has NMOS transistors MN22 and MN23. The NMOS transistor MN23 has its drain coupled to the anode A, its gate coupled to the trigger gate TG, and its source coupled to the cathode K via the NMOS transistor MN22. The NMOS transistor MN22 has its drain coupled to the source of the NMOS transistor MN21, and its gate and source coupled to the cathode K.

When, in the electrostatic protection circuit of FIG. 13A, a voltage equal to or higher than the breakdown voltage of the NMOS transistor MN22 is applied to the trigger gate TG, the NMOS transistors MN22 and MN23 become conductive. In other words, the path between the anode A and the cathode K becomes conductive and functions as an electrostatic protection circuit.

In FIG. 13B, the same reference numerals as those in FIG. 13A indicate the same portions, and description thereof is omitted. In comparison with FIG. 13A, the electrostatic protection circuit of FIG. 13B further has diodes D21 and D22, a PNP transistor Q21, and an NPN transistor Q22. The PNP transistor Q21 has the emitter coupled to the anode A, the base coupled to the drain of the NMOS transistor MN23 and the collector of the NPN transistor Q22, and the collector coupled to the base of the NPN transistor Q22. The NPN transistor Q22 has the emitter coupled to the cathode K. The diode D21 is coupled between the trigger gate TG and the cathode K in a reversed direction; and the diode D22 is coupled between the anode A and the cathode K in a reversed direction.

In the electrostatic protection circuit of FIG. 13B, the PNP transistor Q21 and the NPN transistor Q22a form a thyristor (SCR). When the voltage equal to or higher than the breakdown voltage of the NMOS transistor MN22 is applied to the trigger gate TG, the NMOS transistors MN22 and MN23 functioning as a trigger element are turned on. Thereby the PNP transistor Q21 turns on and the NPN transistor Q22 turns on. In other words, the path between the anode A and the cathode K becomes conductive and functions as an electrostatic protection circuit.

In FIGS. 13A and 13B, the NMOS transistors MN22 and MN23 are vertically stacked, and the gate of the NMOS transistor MN23 is coupled to the node N2 of the voltage divider circuit 10d, and is provided with a bias therefrom. Therefore, the NMOS transistor MN23 can be provided with an appropriate bias, whereby a highly reliable circuit can be realized using the transistors having a lower withstand voltage.

[Fourth Embodiment]

Figure 14:
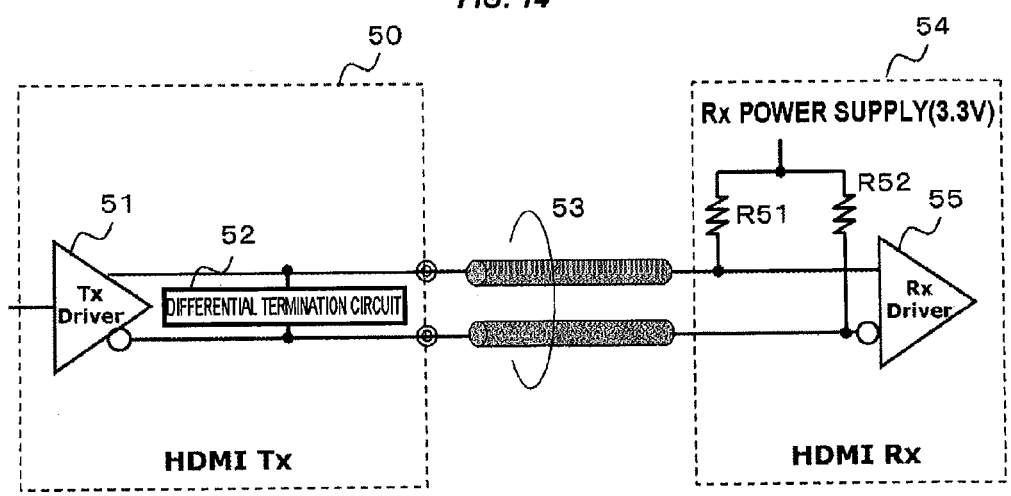
FIG. 14 illustrates a configuration of a transmission system using a differential output circuit.

Next, a termination circuit used for a differential output circuit will be described. FIG. 14 illustrates a configuration of a transmission system using the differential output circuit. In FIG. 14, the transmission system has a transmitting unit 50, a differential transmission line 53, and a receiving unit 54. The transmitting unit 50 has a differential output circuit 51 and a differential termination circuit 52. The receiving unit 54 has resistance elements R51 and R52 and a differential receiving circuit 55. Here, the differential output circuit 51 is a differential output circuit which has been described in the First to the Third Embodiment.

The differential output circuit 51 is coupled to the differential receiving circuit 55 via the differential transmission line 53. In addition, the two output ends of the differential output circuit 51 which output signals having mutually reversed phases are terminated by the differential termination circuit 52. The two input ends having mutually reversed phases of the differential receiving circuit 55 are coupled to an Rx power supply (e.g., 3.3 V) of the receiving side via the resistance elements R51 and R52, respectively.

A differential signal which has been output from the differential output circuit 51 is received by the differential receiving circuit 55 via the differential transmission line 53. The output ends of the differential output circuit 51 have power supplied thereto from the Rx power supply via the resistance elements R51 and R52.

Figure 15:
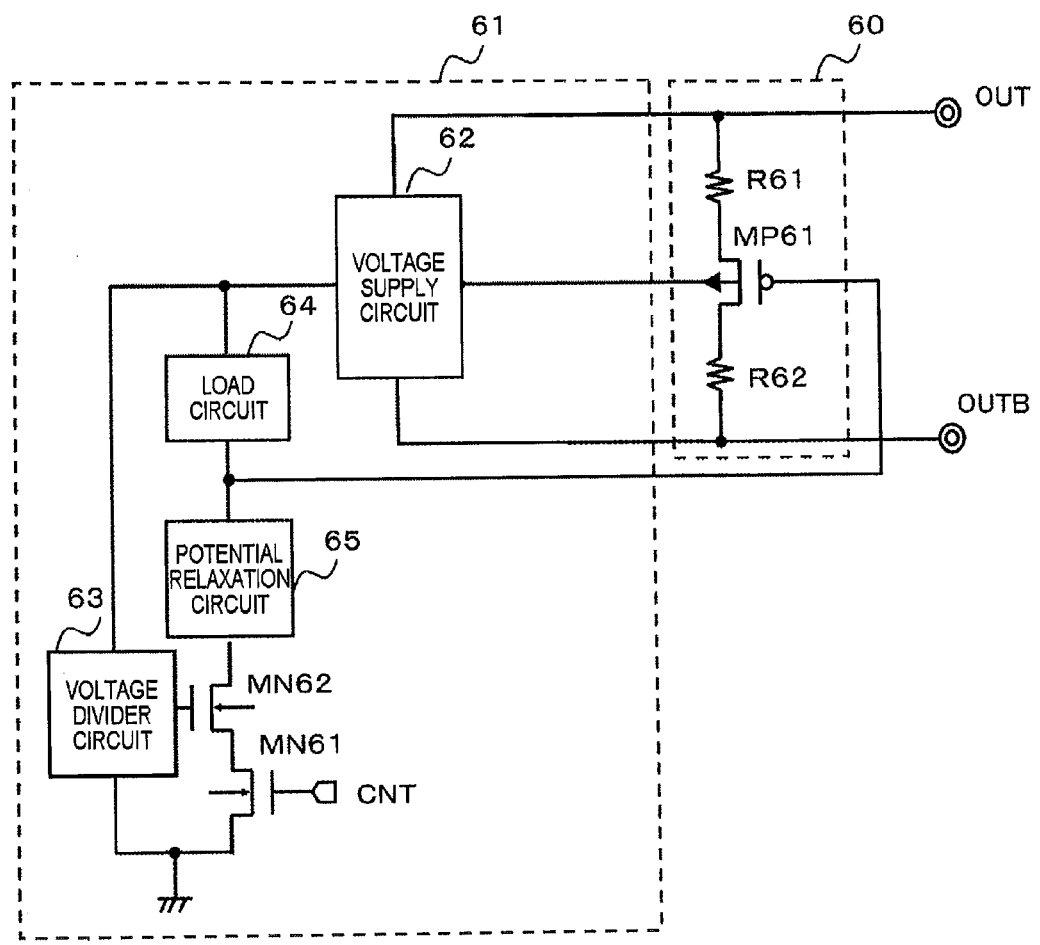
FIG. 15 is a circuit diagram of a differential termination circuit according to a Fourth Embodiment.

Next, the differential termination circuit 52 will be described. FIG. 15 is a circuit diagram of the differential termination circuit according to the Fourth Embodiment. In FIG. 15, the differential termination circuit has a termination circuit 60 and a control circuit 61.

The termination circuit 60, formed by a series circuit of the resistance element R61, the PMOS transistor MP61, and the resistance element R62, is coupled between the output terminals OUT and OUTB.

The control circuit 61 has a voltage supply circuit 62, a voltage divider circuit 63, a load circuit 64, a potential relaxation circuit 65, and the NMOS transistors MN61 and MN62.

The voltage supply circuit 62, coupled between the output terminals OUT and OUTB, provides the intermediate potential between respective potentials of the output terminals OUT and OUTB to the back gate of the PMOS transistor MP61 and one end of the voltage divider circuit 63 and the load circuit 64, respectively.

The voltage divider circuit 63 divides the intermediate potential between respective potentials of the output terminals OUT and OUTB and provides the divided potential to the gate of the NMOS transistor MN62.

The load circuit 64 is coupled at the other end to the gate of the PMOS transistor MP61 and one end of the potential relaxation circuit 65.

The potential relaxation circuit 65 is coupled at the other end to the drain of the NMOS transistor MN62. The NMOS transistor MN62 has its source coupled to the drain of the NMOS transistor MN61.

The NMOS transistor MN61, having the source grounded, receives at the gate a signal CNT indicating whether or not to activate the termination circuit 60.

Figure 16:
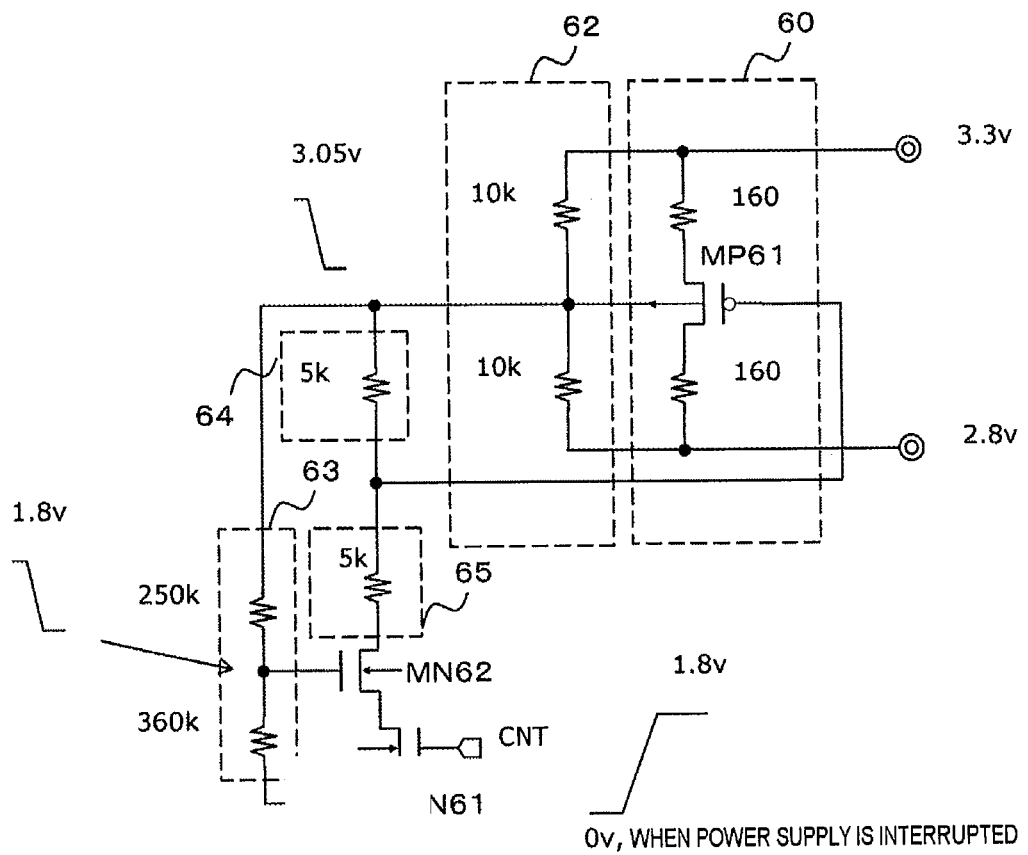
FIG. 16 is a circuit diagram illustrating a specific example of the differential termination circuit according to the Fourth Embodiment.

Next, a specific example of the differential termination circuit 52 will be described. FIG. 16 is a circuit diagram illustrating a specific example of the differential termination circuit 52. Here, resistance values of the resistance elements R61 and R62 are 160Ω, the voltage supply circuit 62 is formed by a series coupling of two resistance elements having a resistance value 10 kΩ, the voltage divider circuit 63 is formed by a series coupling of two resistance elements having resistance values of 250 kΩ and 360 kΩ, the load circuit 64 is formed by a resistance element having a resistance value of 5 kΩ, and the potential relaxation circuit 65 is formed by a resistance element having a resistance value of 5 kΩ.

Figure 17:
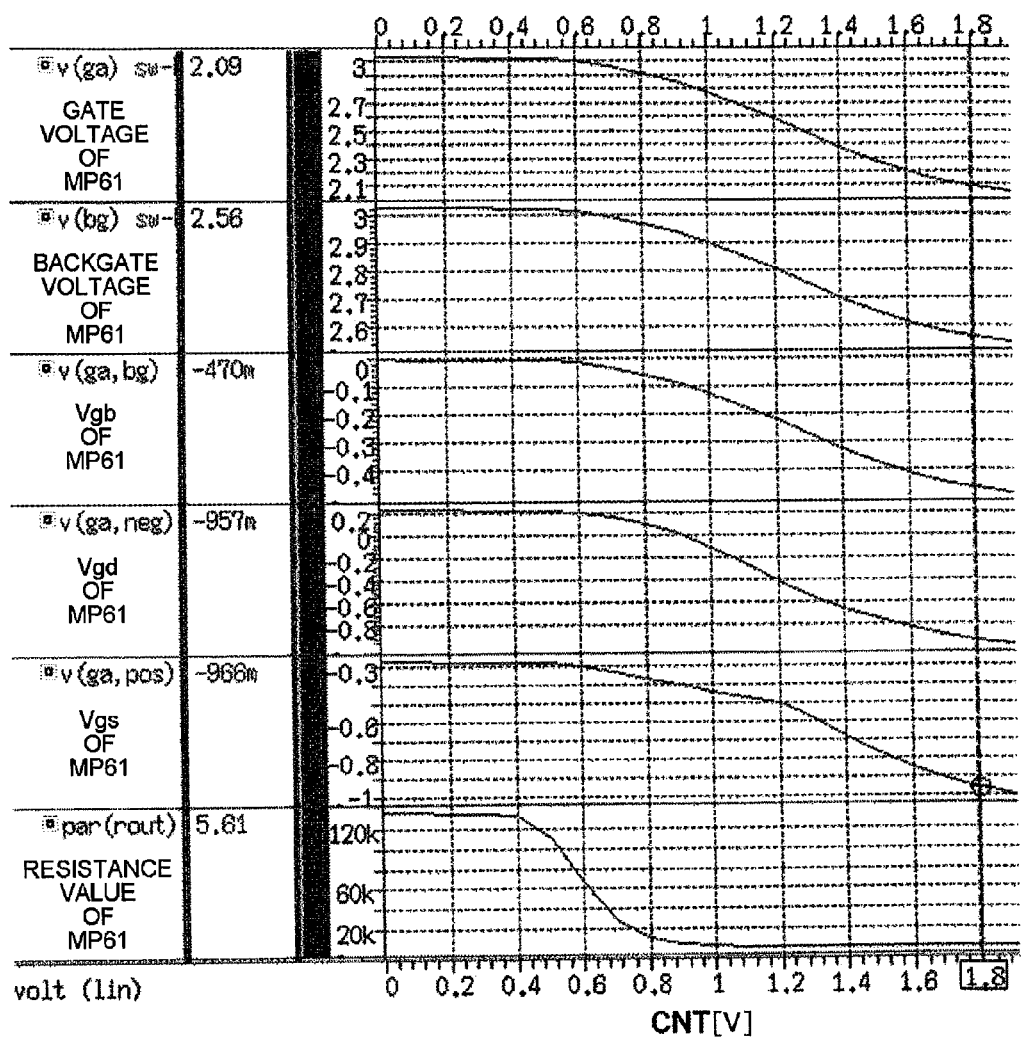
FIG. 17 illustrates variation of potential of respective parts of an NMOS transistor MN61.

In the differential termination circuit configured as described above, respective potentials of the output terminals OUT and OUTB are assumed to be 3.3 V and 2.8 V, for example. When the signal CNT varies from 0 V to 1.8 V, variation of the potential of respective parts of the NMOS transistor MN61 is illustrated in FIG. 17.

When the signal CNT is 0 V, the NMOS transistors MN61 and MN62 are turned off, and the voltage supply circuit 62 provides the gate of the PMOS transistor MP61 with an intermediate potential 3.05 V between respective potentials of the output terminals OUT and OUTB. Since the PMOS transistor MP61 has the potentials of 3.3 V and 2.8 V at both ends, it turns off, and the termination circuit 60 is deactivated and becomes an open state (non-terminated state).

In this case, voltages of the gate, the back gate, the source, and the drain in the PMOS transistor MP61 become 3.05 V, 3.05 V, 3.3 V, and 2.8 V, respectively, whereby the potential difference applied to the gate oxide film of the PMOS transistor MP61 can be suppressed within a tolerable range (equal to or lower than about 2 V).

When, on the other hand, the signal CNT is 1.8 V, the NMOS transistors MN61 and MN62 turn on, lowering the gate potential of the PMOS transistor MP61 thereby. Therefore, the PMOS transistor MP61 turns on, and the termination circuit 60 becomes short-circuited (terminated state). In other words, the termination circuit 60 is activated; the path between the output terminals OUT and OUTB is terminated by 160Ω+160Ω+on-resistance (a few Ω) of the PMOS transistor MP61.

In this case, voltages of the gate, the back gate, the source, and the drain in the PMOS transistor MP61 become 2.09 V, 2.56 V, 3.3 V, and 2.8 V, respectively, and voltages between the gate and the back gate, between the gate and the drain, and between the drain and the source of the PMOS transistor MP61 become 0.47 V, 0.957 V, and 0.965 V, respectively, whereby the potential difference can be suppressed within a tolerable range (equal to or lower than about 2 V).

In the differential termination circuit which operates as described above, the NMOS transistors MN61 and MN62 have a vertically stacked configuration, and the gate of the NMOS transistor MN62 is provided with a bias obtained by dividing the intermediate potential between respective potentials of the two output terminals OUT and OUTB by the voltage divider circuit 63. Therefore, the NMOS transistor MN62 can be provided with an appropriate bias, whereby a highly reliable circuit can be realized using the transistors having a lower withstand voltage.

Next, a modification of the differential termination circuit 52 will be described.

Figure 18:
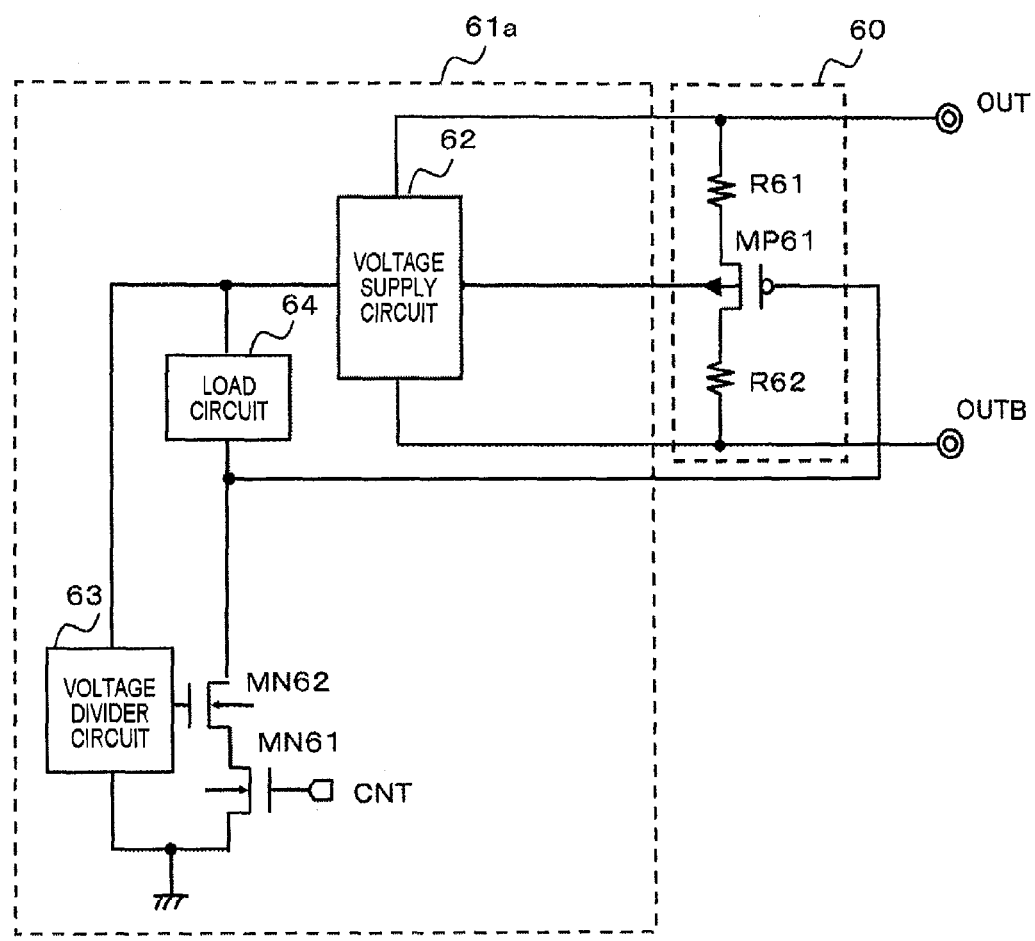
FIG. 18 is a circuit diagram illustrating a Modification 1 of the differential termination circuit according to the Fourth Embodiment.

As long as the NMOS transistor MN62 can be provided with an appropriate bias, as illustrated in a control circuit 61a of FIG. 18, the potential relaxation circuit 65 is omitted so as to become short-circuited.

Figure 19:
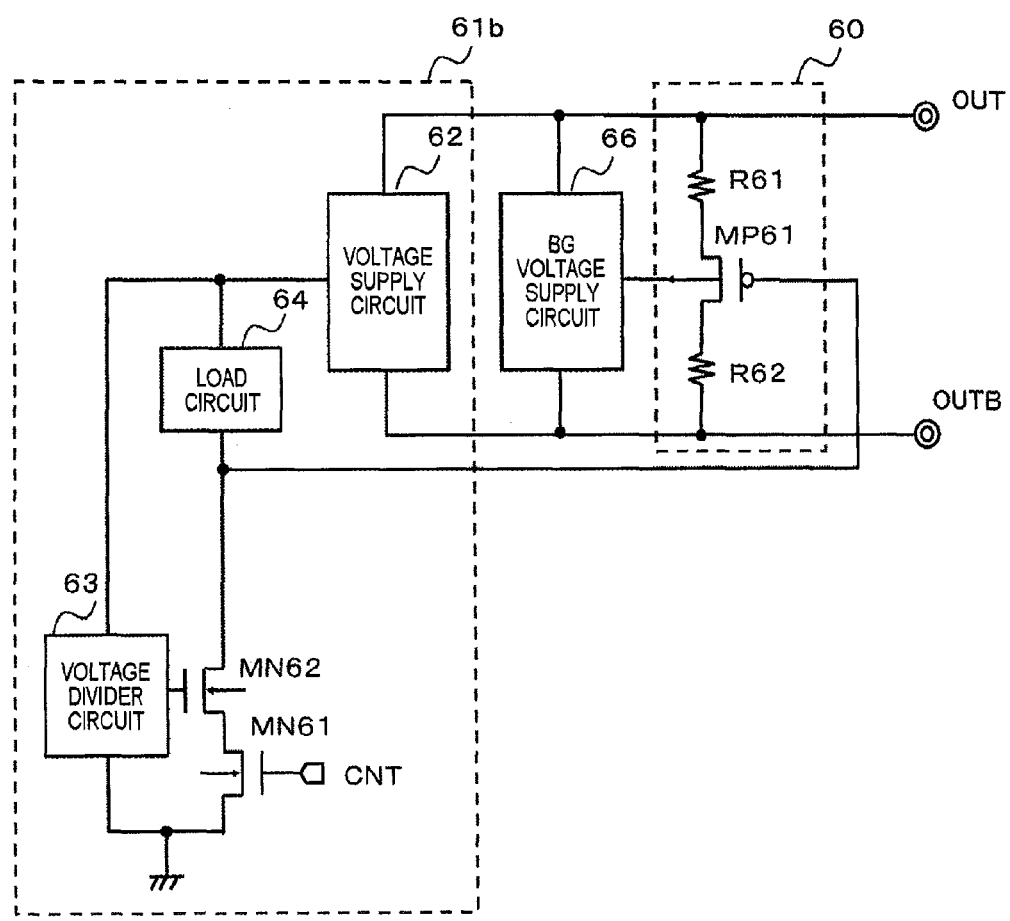
FIG. 19 is a circuit diagram illustrating a Modification 2 of the differential termination circuit according to the Fourth Embodiment.

In addition, as illustrated in a control circuit 61b of FIG. 19, a BG voltage supply circuit 66 which provides the intermediate potential to the back gate of the PMOS transistor MP61 may be provided separately from the voltage supply circuit 62. In this case, the BG voltage supply circuit 66 is configured similarly to the voltage supply circuit 62.

Figure 20:
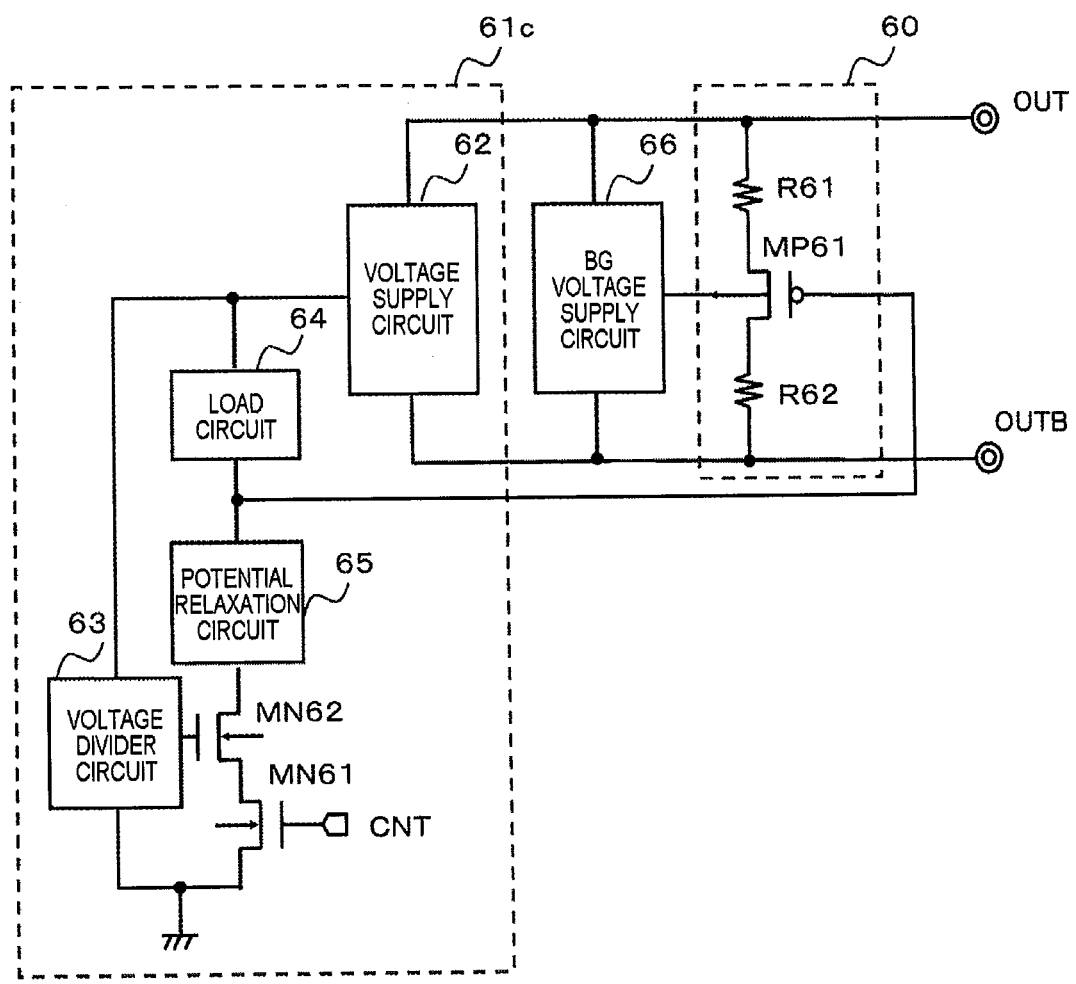
FIG. 20 is a circuit diagram illustrating a Modification 3 of the differential termination circuit according to the Fourth Embodiment.

Furthermore, as illustrated in a control circuit 61c of FIG. 20, the potential relaxation circuit 65 maybe inserted between the load circuit 64 and the NMOS transistor MN62, in comparison with FIG. 19.

Figure 21:
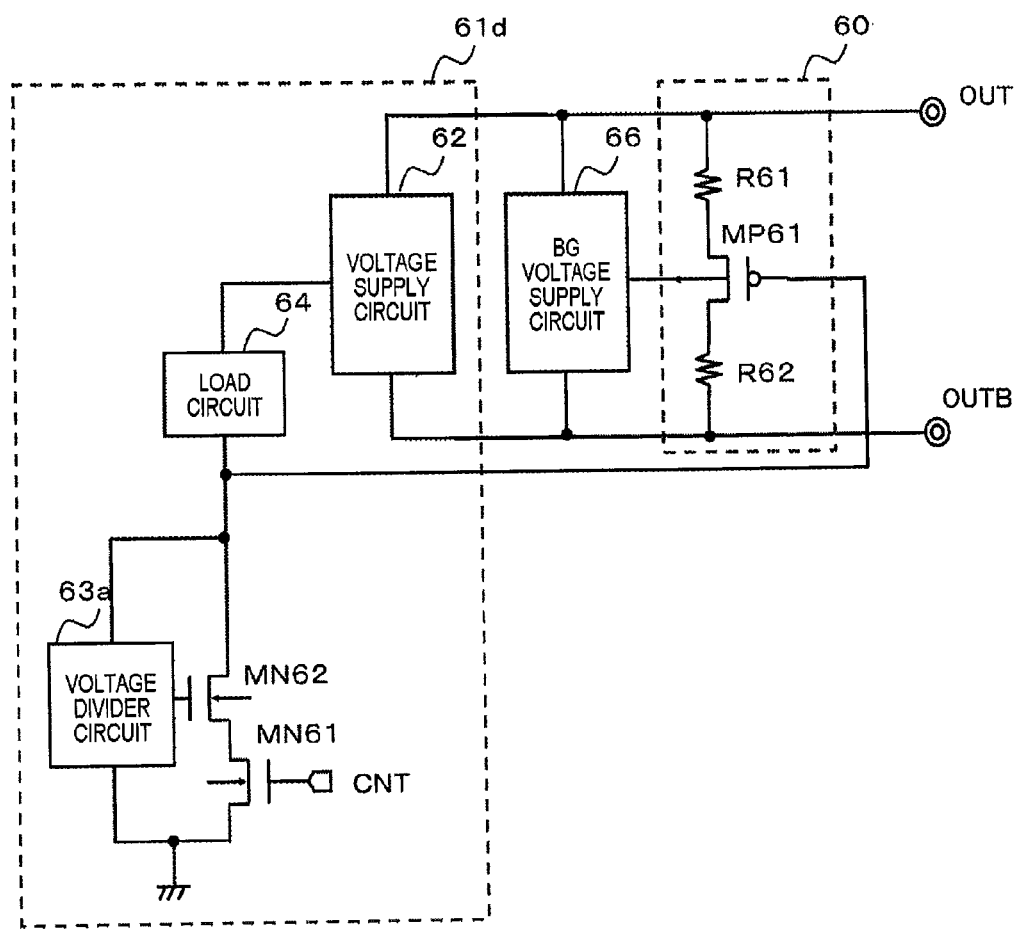
FIG. 21 is a circuit diagram illustrating a Modification 4 of the differential termination circuit according to the Fourth Embodiment.

In addition, as illustrated in a control circuit 61d of FIG. 21, one end of a voltage divider circuit 63a may be coupled to the other end of the load circuit 64.

Figure 22:
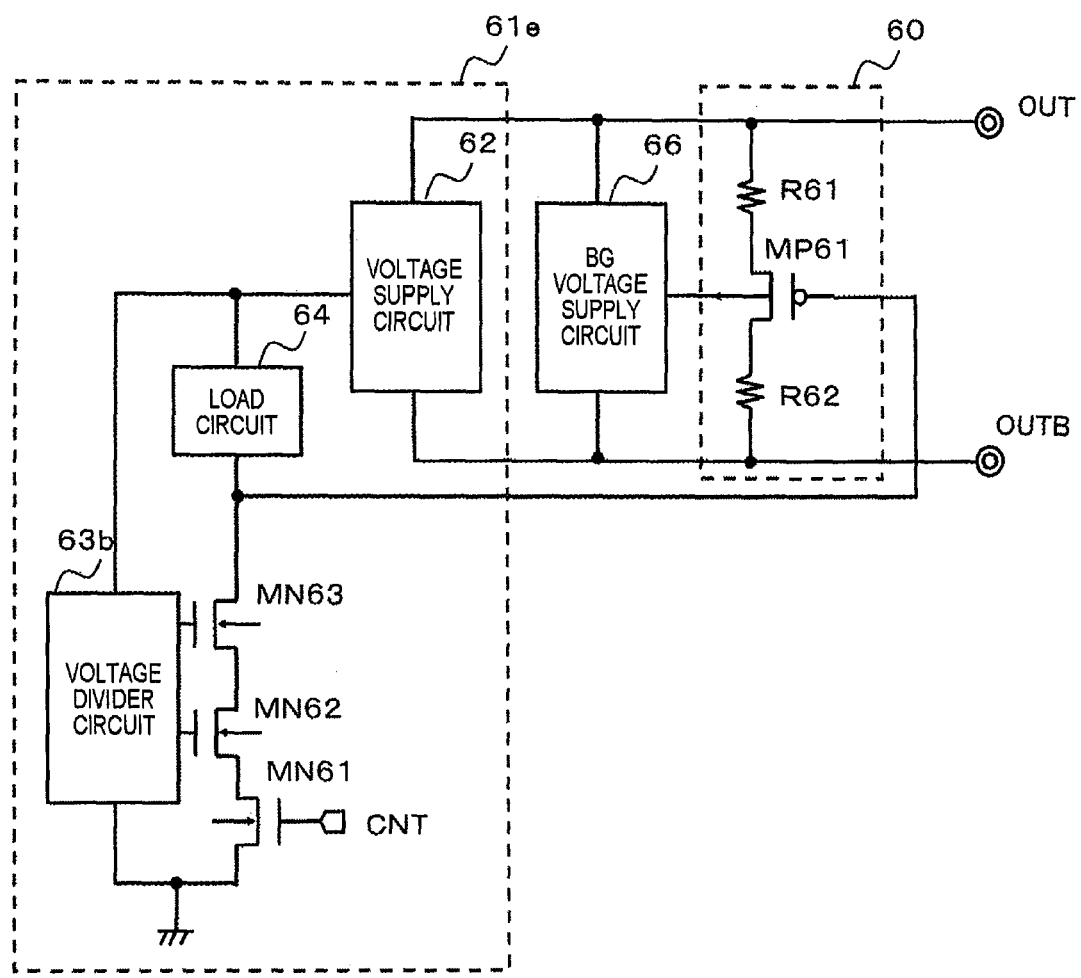
FIG. 22 is a circuit diagram illustrating a Modification 5 of the differential termination circuit according to the Fourth Embodiment.

Furthermore, as illustrated in a control circuit 61e of FIG. 22, an NMOS transistor MN63 maybe inserted between the other end of the load circuit 64 and the NMOS transistor MN62, and the NMOS transistor MN63 may be provided with the gate bias by a voltage divider circuit 63b. In this case, the configuration of the three vertically stacked NMOS transistors MN61, MN62, and MN63 more facilitates the design for voltage distribution.

In a variety of modifications described above, the NMOS transistor MN62 can also be provided with an appropriate bias, whereby a highly reliable circuit can be realized using a transistor having a lower withstand voltage.

[Fifth Embodiment]

Figure 23:
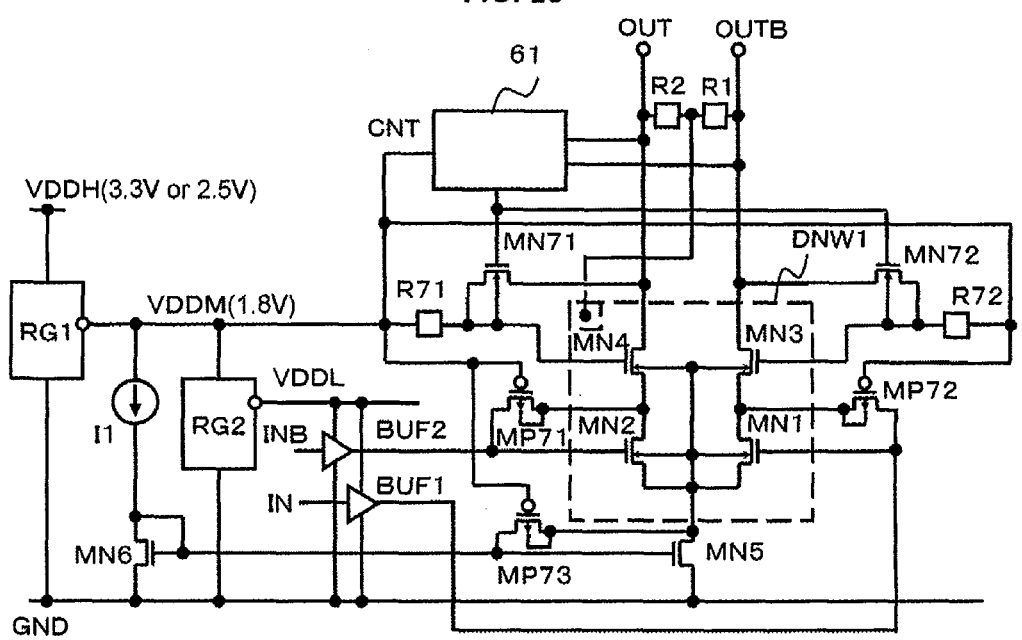
FIG. 23 is a circuit diagram of a differential output circuit according to a Fifth Embodiment.

Next, other embodiment of the differential output circuit will be described. FIG. 23 is a circuit diagram of a differential output circuit according to a Fifth Embodiment. In FIG. 23, the same reference numerals as those in FIGS. 5A to 5B indicate the same portions, and description thereof is omitted. The differential output circuit illustrated in FIG. 23, has not the voltage divider circuit 10, the PMOS transistor MP2, and the resistance element R15 in FIGS. 5A to 5B, but a control circuit 61, NMOS transistors MN71 and MN72, PMOS transistors MP71 to MP73, and resistance elements R71 and R72.

The control circuit 61, which is a circuit described in the Fourth Embodiment and uses the signal CNT as the power supply VDDM, couples the coupling point of the load circuit 64 and the potential relaxation circuit 65 of FIG. 15 to respective gates of the NMOS transistors MN71 and MN72. The control circuit 61 may be the control circuits 61a to 61e in the Fourth Embodiment.

The NMOS transistor MN71 (MN72) has its drain coupled to the drain of the NMOS transistor MN4 (MN3), its back gate and source coupled to the gate of NMOS transistor MN4 (MN3).

The resistance element R71 (R72) is coupled at one end to the power supply VDDM, and coupled at the other end to the gate of NMOS transistor MN4 (MN3).

The PMOS transistors MP71 to MP73 have their drains respectively coupled to respective gates of the NMOS transistors MN2, MN1, and MN5, their back gates and sources respectively coupled to respective drains of the NMOS transistors MN2, MN1, and MN5, and their gates respectively coupled in common to the power supply VDDM.

In the differential output circuit configured as described above, when a normal voltage (e.g., 1.8 V) is provided to the power supply VDDM, the PMOS transistors MP71 to MP73 are turned off. In addition, since the control circuit 61 has the power supply VDDM (e.g., 1.8 V) input thereto as the signal CNT, the NMOS transistors MN71 and MN72, with their gates respectively being almost equal to the ground potential, are turned off. Therefore, the gate of the NMOS transistor MN4 (MN3) is provided with the power supply VDDM as a bias via the resistance element R71 (R72). In addition, the NMOS transistors MN1, MN2 and MN5 function as a differential pair which amplifies the input signals IN and INB. In other words, they function as the CML circuit similar to the First Embodiment.

When, on the other hand, the power supply VDDM is shut down (becoming the potential 0 V of the ground GND), the PMOS transistors MP71 to MP73 are turned on. In addition, since the control circuit 61 has the ground potential input thereto as the signal CNT, the NMOS transistors MN71 and MN72 are turned on because their gates respectively become the intermediate potential between the potentials of the output terminals OUT and OUTB. Therefore, the vertically stacked NMOS transistors MN3 (MN4), MN1 (MN2), and MN5 with the three-tier configuration are all turned on so that their gates are respectively provided with a bias, and divide the voltage applied to the output terminal OUT (OUTB) into three stages. According to such a circuit, a highly reliable circuit can be realized using transistors having a lower withstand voltage.

FIG. 24 is a circuit diagram illustrating a modification of the differential output circuit according to the Fifth Embodiment. In FIG. 24, the same reference numerals as those in FIG. 23 indicate the same portions, and description thereof is omitted. The differential output circuit illustrated in FIG. 24 has resistance elements R73 to R75, respectively, in place of the PMOS transistors MP71 to MP73 in FIG. 23.

By sufficiently raising the resistance value of the resistance elements R73 to R75, when a normal voltage (e.g., 1.8 V) is provided to the power supply VDDM, the differential output circuit configured as described above functions similarly to FIG. 23.

In addition, when the power supply VDDM is shut down (becoming 0 V), the NMOS transistors MN71 and MN72 are turned on. In addition, the NMOS transistors MN1, MN2, and MN5 have their gates respectively provided with a bias via the resistance elements R74, R73, and R75. Therefore, the vertically stacked NMOS transistor MN3 (MN4), MN1 (MN2), MN5 with the three-tier configuration are turned on and function similarly to FIG. 23.

In the present embodiment, it is needless to say that a variety of modifications are applicable such as separation or AC coupling of the well described in the First Embodiment.

The differential output circuit according to respective embodiments described above is preferable for increasing speed and reducing power consumption in a DVI (Digital Visual Interface), an HDMI (High Definition Multimedia Interface), or the like.

Although the invention made by the inventors has been specifically described above based on the embodiments, it is needless to say that the present invention is not limited to the embodiments, and may be modified in various ways within a range not deviating from the scope thereof.

Disclosures of the above-mentioned Patent Documents or the like are respectively incorporated in this specification by citation thereof. Within the scope of all the disclosures (including claims) of the present invention, and further based on essential technical ideas thereof, modification/adjustment of the embodiments and the examples may be performed. In addition, a variety of combinations or selections of various disclosed elements (including each element of each claim, each element of each example, each element of each drawing, etc.) is possible within the scope of the claims of the present invention. In other words, the present invention obviously includes a variety of modifications, revisions, or the like which can be made by a person skilled in the art according to all the disclosures and technical ideas including the claims.

What is claimed is:

1. A differential output circuit comprising:
    a differential pair including a first transistor and a second transistor which respectively receive input signals having mutually reversed phases;
    a third transistor and a fourth transistor respectively cascode-coupled to the first transistor and the second transistor, and having the same conductivity type as the first transistor and the second transistor;
    a first output terminal and a second output terminal coupled to respective drains of the third transistor and the fourth transistor;
    a voltage divider circuit which divides an intermediate potential between respective potentials of the first output terminal and the second output terminal and supplies the divided potential to respective gates of the third transistor and the fourth transistor;
    two buffer circuits which supply the respective input signals to respective gates of the first transistor and the second transistor; and
    a power supply circuit which lowers a first power supply voltage and supplies the lowered voltage to the two buffer circuits as a second power supply voltage.

2. The differential output circuit according to claim 1, wherein the voltage divider circuit is configured to change a voltage dividing ratio when a potential of either the first or the second output terminal is within a predetermined range.

3. The differential output circuit according to claim 1, wherein the voltage divider circuit is configured to change a voltage dividing ratio when the second power supply voltage is within a predetermined range.

4. The differential output circuit according to claim 1, wherein a current supply forming the differential pair is activated when the first power supply voltage is within a predetermined range.

5. The differential output circuit according to claim 4,
wherein the current supply is deactivated when the second power supply voltage is not output from the power supply circuit.

6. The differential output circuits according to claim 1,
wherein the two buffer circuits are respectively AC-coupled to respective gates of the first transistor and the second transistor so as to provide respective gates of the first transistor and the second transistor with the input signals which have been offset by an amount of the second power supply voltage.

7. A differential output circuit comprising:
a differential pair including a first transistor and a second transistor which respectively receive input signals having mutually reversed phases;
a third transistor and a fourth transistor respectively cascode-coupled to the first transistor and the second transistor, and having the same conductivity type as the first transistor and the second transistor;
a first output terminal and a second output terminal coupled to respective drains of the third transistor and the fourth transistor;
a voltage divider circuit which divides an intermediate potential between respective potentials of the first output terminal and the second output terminal and supplies the divided potential to respective gates of the third transistor and the fourth transistor;
two buffer circuits which supply the respective input signals to respective gates of the first transistor and the second transistor; and
a power supply circuit which lowers a first power supply voltage and supplies the lowered voltage to the two buffer circuits as a second power supply voltage,
wherein the voltage divider circuit is configured to change a voltage dividing ratio when the second power supply voltage is within a predetermined range.

8. The differential output circuit according to claim 7,
wherein a current supply forming the differential pair is activated when the first power supply voltage is within a predetermined range.

9. The differential output circuit according to claim 8,
wherein the current supply is deactivated when the second power supply voltage is not output from the power supply circuit.

10. The differential output circuits according to claim 7,
wherein the two buffer circuits are respectively AC-coupled to respective gates of the first transistor and the second transistor so as to provide respective gates of the first transistor and the second transistor with the input signals which have been offset by an amount of the second power supply voltage.

11. A differential output circuit comprising:
a differential pair including a first transistor and a second transistor which respectively receive input signals having mutually reversed phases;
a third transistor and a fourth transistor respectively cascode-coupled to the first transistor and the second transistor, and having the same conductivity type as the first transistor and the second transistor;
a first output terminal and a second output terminal coupled to respective drains of the third transistor and the fourth transistor;
a voltage divider circuit which divides an intermediate potential between respective potentials of the first output terminal and the second output terminal and supplies the divided potential to respective gates of the third transistor and the fourth transistor;
two buffer circuits which supply the respective input signals to respective gates of the first transistor and the second transistor; and
a power supply circuit which lowers a first power supply voltage and supplies the lowered voltage to the two buffer circuits as a second power supply voltage,
wherein the differential pair has a current supply that is activated when the first power supply voltage is within a predetermined range.

12. The differential output circuit according to claim 11,
wherein the voltage divider circuit is configured to change a voltage dividing ratio when a potential of either the first output terminal or the second output terminal is within a predetermined range.

13. The differential output circuit according to claim 11,
wherein the voltage divider circuit is configured to change a voltage dividing ratio when the second power supply voltage is within a predetermined range.

14. The differential output circuit according to claim 4,
wherein the current supply is deactivated when the second power supply voltage is not output from the power supply circuit.

15. The differential output circuits according to claim 1,
wherein the two buffer circuits are respectively AC-coupled to respective gates of the first transistor and the second transistor so as to provide respective gates of the first transistor and the second transistor with the input signals which have been offset by an amount of the second power supply voltage.

* * * * *